(12) United States Patent
Shigeta et al.

(10) Patent No.: US 6,319,749 B1
(45) Date of Patent: Nov. 20, 2001

(54) LEAD FRAME, SEMICONDUCTOR PACKAGE HAVING THE SAME AND METHOD FOR MANUFACTURING THE SAME

(75) Inventors: Hiroyuki Shigeta; Kenji Osawa; Kazuhiro Sato; Haruhiko Makino; Makoto Ito, all of Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/562,750

(22) Filed: May 2, 2000

Related U.S. Application Data

(62) Division of application No. 08/909,814, filed on Aug. 12, 1997, now Pat. No. 6,107,678.

(30) Foreign Application Priority Data

| Aug. 13, 1996 | (JP) | 8-213843 |
| Aug. 23, 1996 | (JP) | 8-222033 |
| Sep. 2, 1996 | (JP) | 8-231538 |
| Sep. 5, 1996 | (JP) | 8-235102 |

(51) Int. Cl.[7] .................... H01L 21/44; H01L 21/50; H01L 21/30
(52) U.S. Cl. .................... 438/106; 438/123; 438/111; 438/455
(58) Field of Search .................... 438/106, 111, 438/123, 112, 124, 127, 108, 455; 257/673, 676, 690, 766, 781, 787

(56) References Cited

U.S. PATENT DOCUMENTS

| 6,171,877 | * | 1/2001 | Webb ..................................... 438/25 |
| 6,171,888 | * | 1/2001 | Lynch et al. .......................... 438/123 |
| 6,194,247 | * | 2/2001 | Burns et al. .......................... 438/107 |
| 6,194,291 | * | 2/2001 | DiStefano et al. .................... 438/455 |
| 6,200,831 | * | 3/2001 | Tanaka et al. ........................ 438/106 |
| 6,214,641 | * | 4/2001 | Akram .................................. 438/107 |
| 6,238,938 | * | 5/2001 | Smith ..................................... 438/10 |
| 6,248,613 | * | 6/2001 | Matsuura et al. ..................... 438/106 |
| 6,251,708 | * | 6/2001 | Brooks et al. ........................ 438/123 |
| 6,258,632 | * | 7/2001 | Takebe ................................. 438/127 |

\* cited by examiner

*Primary Examiner*—Matthew Smith
*Assistant Examiner*—Chuong Luu
(74) *Attorney, Agent, or Firm*—Sonnenschein, Nath & Rosenthal

(57) ABSTRACT

In a lead frame with a reinforcing ring surrounding a semiconductor element which are electrically connected to leads through electrodes is integrally formed through suspending portions, reinforcing portions for reinforcing the suspending portions are provided on the suspending portions. Upon application of a lead frame forming technique in which a laminate plate of three or more layers is used as a base, and inner leads are formed at one side while outer leads are formed by the surface layer at the other side, the lead frame is formed by forming a ring in place of outer leads, for example. A semiconductor package is formed by mounting the lead frame on a semiconductor chip.

5 Claims, 19 Drawing Sheets

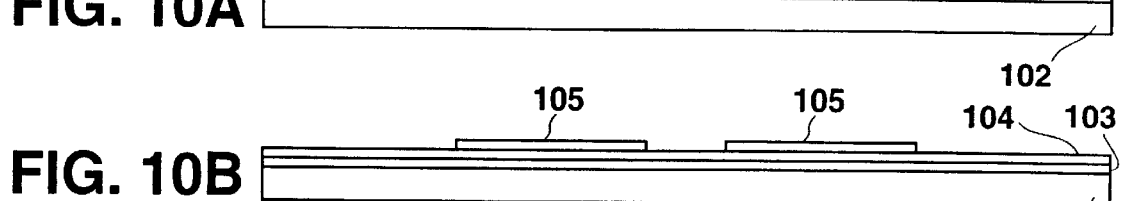
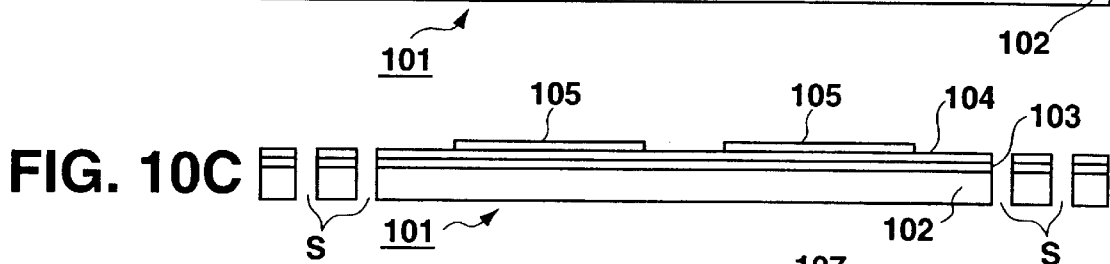
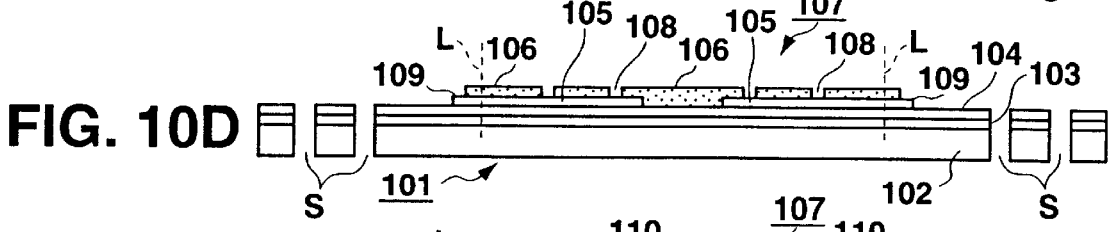
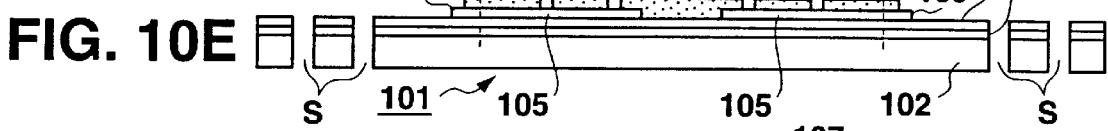
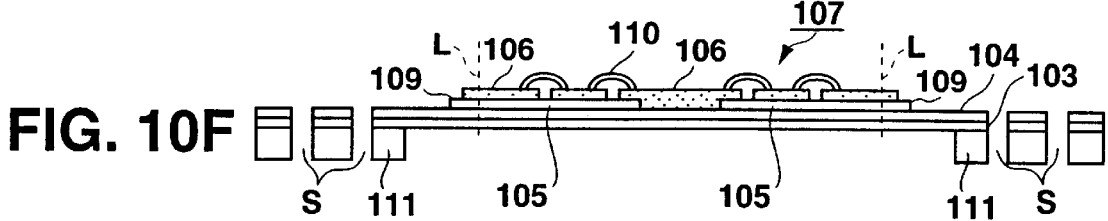
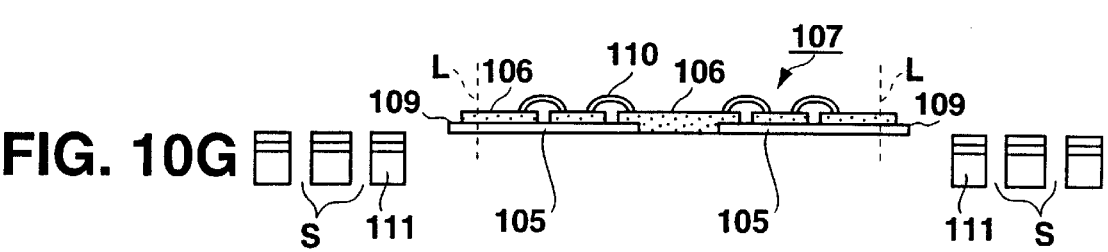
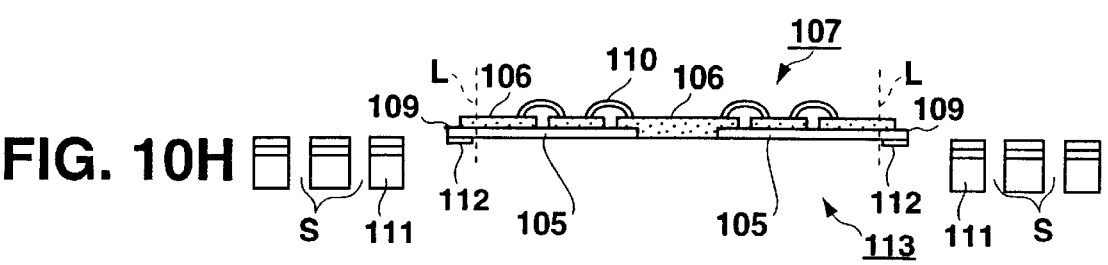

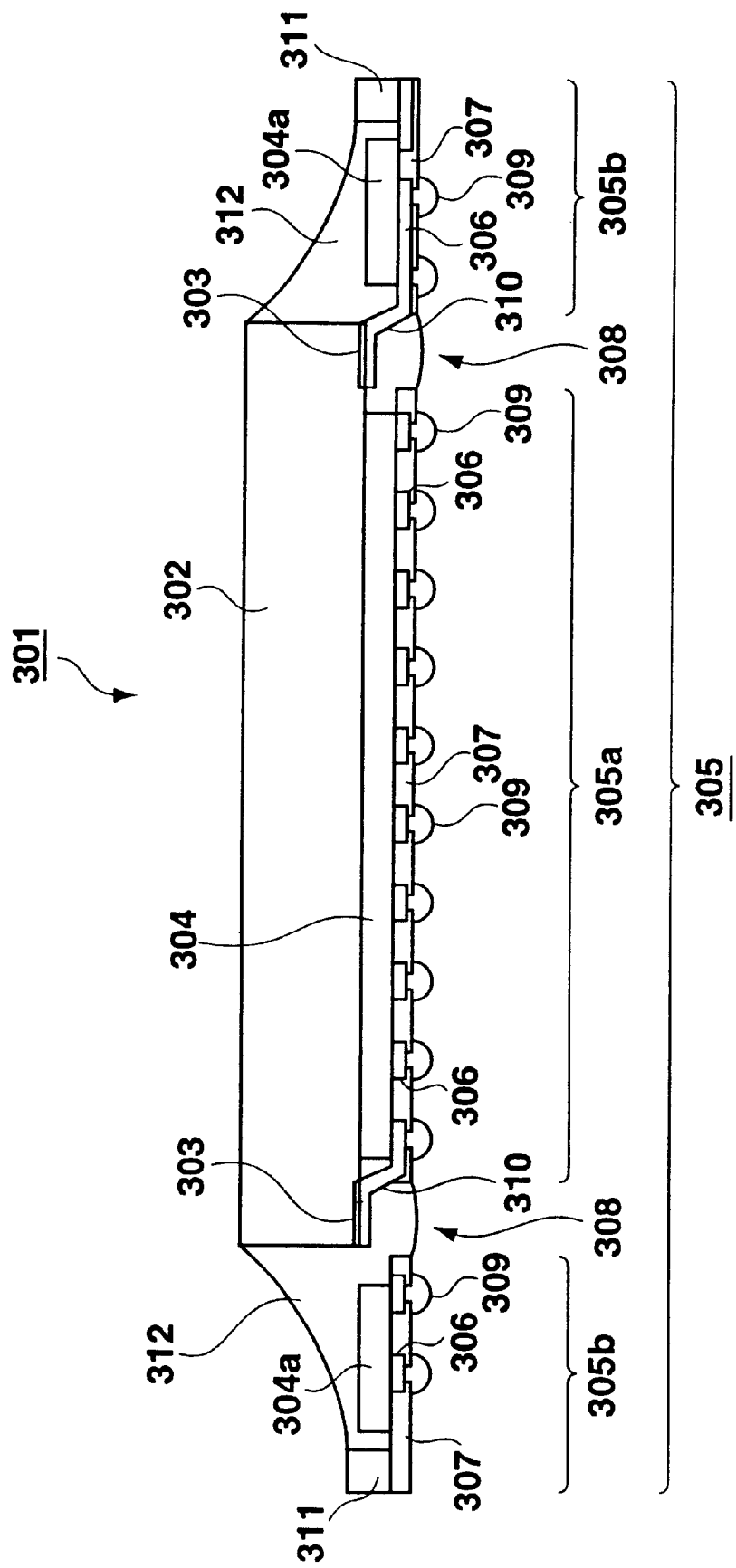

LEAD FRAME, SEMICONDUCTOR PACKAGE HAVING THE SAME AND METHOD FOR MANUFACTURING THE SAME

This application is a divisional application of application Ser. No. 08/909,814 filed Aug. 12, 1997, now U.S. Pat. No. 6,107,678 incorporated herein by reference.

BACKGROUND OF THE INVENTION

The present invention relates to a lead frame having a wiring film obtained by laminating an insulating film on a lead pattern, a semiconductor package having a super multiple pin structure in which a semiconductor element (chip) is joined to the lead frame, and a method for manufacturing the lead frame and the semiconductor package.

The following semiconductor device is proposed by the applicant of this application. That is, a lead frame in which leads to be connected to electrodes of a semiconductor element at one end portions thereof are formed on one surface side of an insulating film, and further the external terminals connected to the other end portions of the leads are formed on the other surface side of the insulating film, is mounted on the semiconductor element, and a reinforcing outer ring surrounding the semiconductor element is formed at the outside of the semiconductor element.

However, in such a semiconductor device, it is indispensable to fill sealing agent in a gap between the outer ring and the semiconductor element after the outer ring surrounding the semiconductor element is disposed and the outer ring and the semiconductor element are positioned. The necessity of the positioning process obstructs the reduction in the number of fabrication processes of the semiconductor device. It is needless to say that this is a cause to obstruct the cost-down of the semiconductor device.

A semiconductor device which can solve the above problem has been proposed. FIG. 1 shows such a semiconductor device, wherein FIG. 1A is a plan view and FIG. 1B is an enlarged cross-sectional view which is taken along B—B line.

In FIGS. 1A and 1B, 1 represents a lead frame (film circuit), and reference numeral 2 represents an insulating film which serves as a base of the lead frame 1. 3 represents leads (wiring films) which are formed at one side (lower side) of the insulating film 2, and the tip portions 3a thereof are connected to electrode pads 5 of a semiconductor element 4. The leads 3 are formed by forming metal such as copper, nickel or the like by using as a mask a resist having a negative pattern to a pattern to be formed.

Reference numeral 6 represents ball-shaped outer terminals formed on the end portions 3b of the leads 3 which are located at the opposite side to the side which is connected to the electrode pads 5 of the semiconductor element 4, and the outer terminals are formed of nickel and soldering or gold. They are formed on a plane which is opposite to the semiconductor element side of the base (insulating film) 2, and connected to the end portions 3b of the leads 3 through holes of the base 2.

Reference numeral 8 represents a reinforcing outer ring which surrounds the semiconductor element 4, and it is formed integrally with the outside of the main portion of the lead frame through suspending portions 10. It has a laminate structure comprising copper, aluminum, copper, nickel or the like. The suspending portions 10 are formed of the same layers as the leads 3, and thus they are formed of copper or nickel, for example.

According to the above lead frame, as shown in FIG. 1A, the outer ring 8 is formed integrally with the outer portion of the main portion 15 of the lead frame through the suspending portions 10. Therefore, as shown in FIG. 1B, the ring 8 can be positioned to the semiconductor element 4 by merely mounting the lead frame 1 on the semiconductor element 4. Accordingly, no special process is needed to dispose the ring 8 in a predetermined positional relationship with the semiconductor element 4.

Accordingly, the number of fabrication steps of the semiconductor device can be reduced, and thus the manufacturing cost of the semiconductor device can be reduced.

In the case of the lead frame described above, the width of the suspending portions is narrow, and for example, it is equal to about 18 to 25 micrometers. Therefore, there is a problem that it is likely to be deformed under application of only a small impact during transportation or fabrication process because the mechanical strength thereof is low.

When the suspending portions of the lead frame are likely to be deformed as described above, the suspending portions are broken in the worst case and the circuit portion falls off, so that the yield is lowered. Further, when the suspending portions of the lead frame are likely to be deformed, the position precision between the circuit portion and the outer ring is lowered, so that a problem occurs in the fabrication process.

FIG. 2 shows a semiconductor package which can be mounted on a print wiring plate or the like through an organic substrate having external connection terminals such as solder balls or the like.

In FIG. 2, a semiconductor chip 51 is mounted on the surface of a multilayered organic wiring board 50 which is formed of organic material and comprises two to six layers. The electrode pads 50 of the semiconductor chip 51 and wiring films 52 are connected to each other by a wire bonding method using gold wires 53 or the like.

Solder balls (external connection terminals) 55 which are electrically connected via through-holes 54 to the wiring films 52 on the obverse surface are provided on the back surface of the multilayered organic wiring substrate 50, and the solder balls 55 are exposed from the open portion of a solder resist film 56 to the outside. The semiconductor chip 51 as well as the gold wires 53 is sealed by sealing resin 57.

In the semiconductor package 58 thus constructed, the solder balls 55 formed on the back surface are connected to the print wiring plate 59. The multilayered organic wiring board 50 is usually called as Ball Grid Array (BGA) because a number of solder balls 55 are arranged in a grid form, and the semiconductor package 58 using the multilayered organic wiring board 50 is called as BGA package.

However, in the above-described semiconductor package 58, the electrode pads of the semiconductor chip 51 and the wiring film 52 of the multilayered organic wiring substrate 50 are connected to each other by the wire bonding, and thus there is a limitation in the shortening of the wiring pitch. In other cases, for example, in a semiconductor package which is called as TCP (Table Carrier Package), a copper foil which is attached onto an insulating film base is etched to form leads, and thus there is such restriction that the leads are narrowed due to side etching. Therefore, there is also a limitation in the multiple-pin design.

SUMMARY OF THE INVENTION

The present invention has been implemented to solve the above problems of the prior arts, and has a first object to provide a novel lead frame which can prevent the suspending portions from being deformed by merely improving the structure of the suspending portions, and a method of manufacturing the lead frame.

A second object of the present invention is to enhance the reliability of a semiconductor package by preventing the breaking and failure of leads due to environmental stress.

A third object of the present invention is to provide a semiconductor package which can facilitate the resin injection from the back surface of the chip even when the size of the outer ring is small.

A fourth object of the present invention is to provide a semiconductor package in which the chip size can be reduced without reducing the number of external connection terminals.

In order to attain the above objects, according to a first aspect of the present invention, a lead frame is characterized in that reinforcing portions for reinforcing the suspending portions are provided on the suspending portions which support a ring surrounding a semiconductor element.

Accordingly, according to the lead frame described above, the suspending portions are reinforced because the reinforcing portions are provided on the suspending portions, so that the suspending portions can be prevented from being deformed.

Accordingly, there is no possibility that the suspending portions are broken and the circuit portion falls off, and the positional precision between the circuit portion and the outer ring is enhanced, so that no trouble occurs in the fabrication process.

A lead frame manufacturing method according to the present invention is a method for manufacturing the lead frame of claim 1, and includes the steps of forming on one surface side of the laminate plate wiring films and suspending portions by the surface layer thereof or another metal layer formed on the surface layer and forming an insulating film, forming external terminals so as to be connected to other end portions of the wiring films, and at the same time forming reinforcing portions on the suspending portions, and performing a selective etching so as to penetrate through the laminate plate, and performing a selective etching on the layer at the other surface side of the laminate plate to form a ring of the layer.

Accordingly, according to the manufacturing method of the present invention, the laminate plate of three or more layers is used as a base, and a ring is formed in place of an outer lead by applying a lead frame forming technique of forming an inner lead at one side and forming an outer lead by the surface layer at the other side, and the reinforcing portions are formed simultaneously with the external terminals, thereby obtaining a lead frame with a ring. Therefore, the lead frame as described above can be easily obtained by directly using the lead frame manufacturing technique which has been already developed.

According to another aspect of the present invention, in a lead frame of the present invention, the laminate area of the insulating film is further extended toward the extension end side beyond the lead bending position when the plural leads extending from the wiring film are connected to the electrode pads of the semiconductor chip.

In the lead frame thus constructed, when the plural leads extending from the wiring film are connected to the electrode pads of the semiconductor chip, a part of the insulating film is bent together with each lead, whereby the bending position of each lead is reinforced by the insulating film.

Further, according to another aspect of the present invention, a semiconductor package includes a semiconductor chip having plural electrode pads which are formed at the peripheral edge portion on the surface of the chip, a wiring film which is disposed and fixed to the surface side of the semiconductor chip and in which an insulating film is laminated on a lead pattern, plural leads which are extended from the wiring film whose extension end is connected to the electrode pads of said semiconductor chip by a predetermined bending shaping process, the bending position of the extension end being located inside of a laminate area of the insulating film, and sealing resin for sealing a peripheral area of the semiconductor chip which contains a boundary portion between the plural leads and the insulating film.

In the semiconductor package thus constructed, the bending position of the plural leads extending from the wiring film is reinforced by the insulating film, and the reinforced portion is embedded integrally with the leads in the sealing resin. Therefore, even when an environmental stress due to a temperature cycle or the like is applied to the bending position of the leads, the breaking of the leads can be prevented by the reinforcing effect of the insulating film.

According to another aspect of the present invention, a semiconductor package includes a semiconductor chip having plural electrode pads formed at the peripheral edge portion thereof, a wiring film which is disposed at the surface side of the semiconductor chip and formed by laminating an insulating film on a lead pattern, an external connection terminal which is formed on the wiring film so as to project therefrom, plural leads which extend from the wiring film and whose extension ends are connected to the electrode pads of the semiconductor chip, an outer ring which is provided so as to surround the semiconductor chip and has an open portion which is outwardly opened at the back surface side of the semiconductor chip and formed on the inner peripheral surface thereof, and sealing resin filled between the semiconductor chip and the outer ring.

In the semiconductor package thus constructed, the outwardly-opened open portion are formed on the inner peripheral surface of the outer ring surrounding the semiconductor chip so as to be located at the chip back surface side. Therefore, the broad resin injection port at the back surface side of the chip can be secured at the gap portion between the semiconductor chip and the outer ring, whereby even when the size of the outer ring is small, the resin injection from the back surface side of the chip can be readily performed.

Further, according to another aspect of the present invention, a lead frame includes a wiring film which is formed by laminating an insulating film on a lead pattern, an external connection terminal formed on the wiring film so as to project therefrom, plural leads which are extended from the wiring film and whose extension ends serve as connection portions to the electrode pads of the semiconductor chip, and an outer ring which is provided at the outside of the wiring film and has an open portion for accommodating the semiconductor chip therein, an outwardly-opened open portion being formed on the peripheral surface of the open portion so as to be located at the back surface side of the semiconductor chip.

In the lead frame thus constructed, when the semiconductor chip is accommodated at the open portion of the outer ring in a package fabrication process, the broad resin injection portion at the chip back surface side can be secured because the outwardly-opened open portion is formed on the inner peripheral surface of the open portion of the outer ring.

Still further, according to another aspect of the present invention, a semiconductor package includes a semiconductor chip having plural electrode pads at the peripheral edge portion on the surface thereof, a wiring film which is formed so as to be disposed at the surface side of the semiconductor chip, designed in a structure having an insulating film laminated on a lead pattern, the outer dimension of the film being set to be larger than the outer dimension of said semiconductor chip, and has a film open portion along the peripheral edge portion of the semiconductor chip, the inside from the film open portion being set as a first wiring area while the outside from the film open portion is set as a second wiring area, plural external connection terminals which are formed on the wiring film from the first wiring area over the second wiring area so as to be projected, plural leads which extend from the first wiring area and the second wiring area to the film open portion, and whose extension ends are connected to electrode pads of the semiconductor chip, an outer ring which is provided so as to surround the semiconductor chip, and sealing resin filled between the semiconductor chip and the outer ring.

In the semiconductor package thus constructed, the wiring area of the wiring film is extended to the second wiring area disposed at the peripheral portion of the chip as well as the first wiring area disposed on the semiconductor chip, and the external connection terminals are formed over the first and second wiring areas. Therefore, the number of the external connection terminals on the wiring film is restricted by the chip size, so that the chip size can be reduced without reducing the number of external connection terminals.

BRIEF DESCRIPTION OF THE DRAWINGS

FIGS. 3A and 3B show a first embodiment of a lead frame according to the present invention, wherein FIG. 3A is a plan view and FIG. 3B is a cross-sectional view which is taken along A—A line of 3B.

FIGS. 10A to 10H are cross-sectional views showing a method for manufacturing a lead frame according to another embodiment of the present invention.

FIG. 17 is a cross-sectional view showing another embodiment of the semiconductor package of the present invention.

DETAILED DESCRIPTION OF THE PREFERRED EMBODIMENTS

Preferred embodiments according to the present invention will be described hereunder with reference to the accompanying drawings.

Figure 1A:
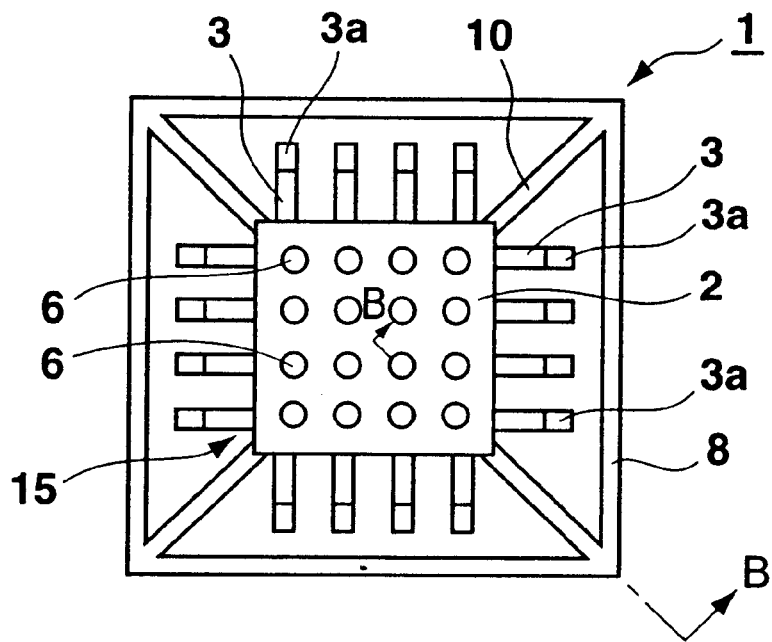
FIG. 1A is a plan view of a semiconductor lead.
Figure 1B:
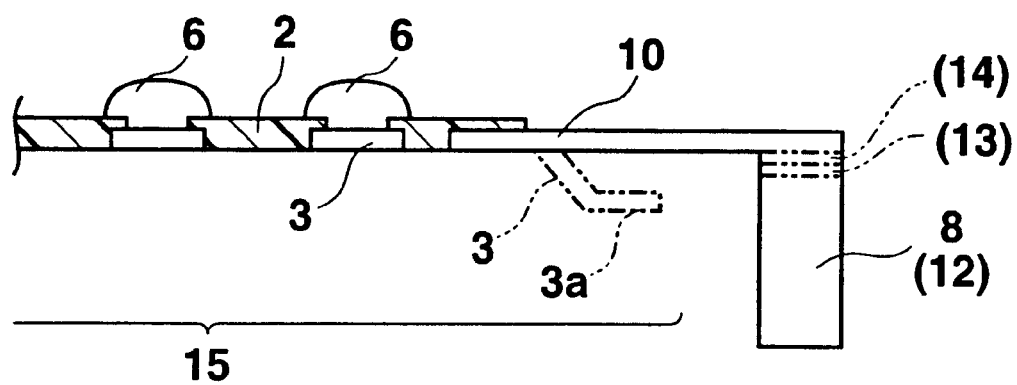
FIG. 1B is a cross-sectional view which is taken along B—B line.
Figure 2:
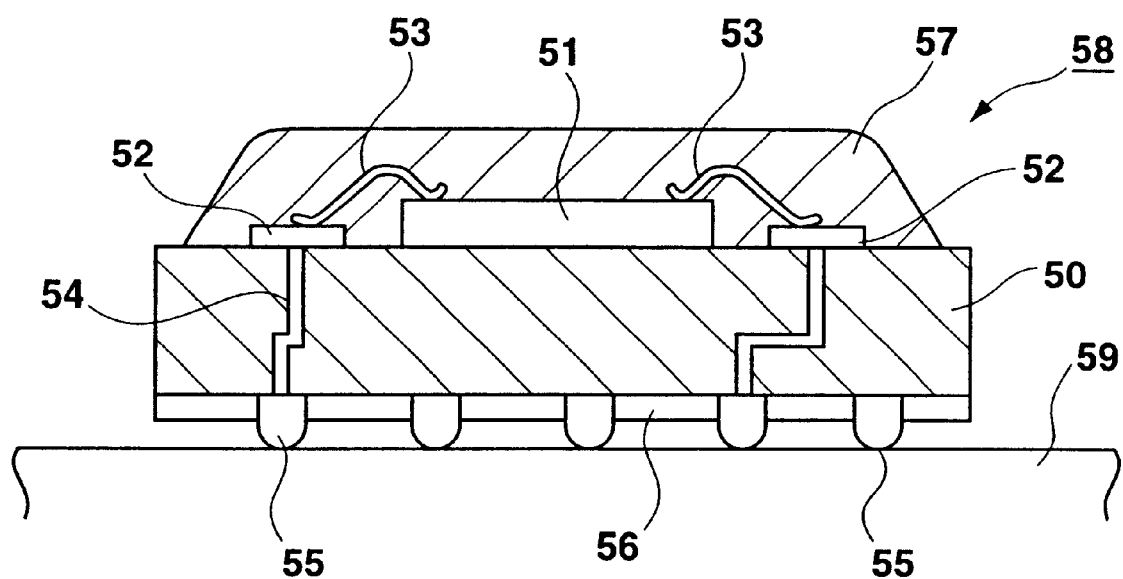
FIG. 2 is a cross-sectional view of a BGA package.
Figure 3A:
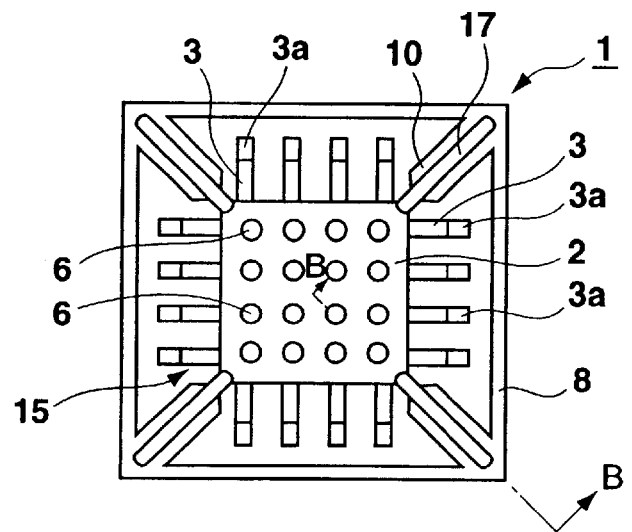
Figure 3B:
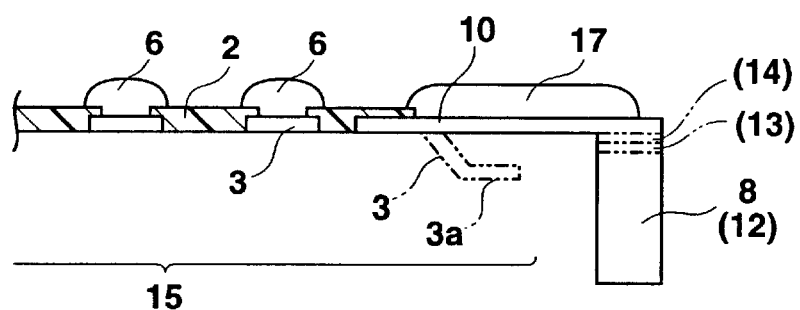

FIGS. 3A and 3B show a first embodiment according to the present invention, wherein FIG. 3A is a plan view and FIG. 3B is an enlarged cross-sectional view which is taken along B—B line of FIG. 3A.

In these figures, reference numeral 1 represents a lead frame (film circuit), and reference numeral 2 represents an insulating film which serves as a base of the lead frame 1. Reference numeral 3 represents leads which are formed at one side (lower side) of the insulating film 2, and the tip portions 3a thereof are connected to electrode pads 5 of a semiconductor element (semiconductor chip) 4. The leads 3 are formed by forming metal such as copper, nickel or the like by using as a mask a resist having a negative pattern to a pattern to be formed.

Reference numeral 6 represents ball-shaped outer terminals formed on the end portions 3b of the leads 3 which are located at the opposite side to the side which is connected to the electrode pads 5 of the semiconductor element 4, and the outer terminals are formed of nickel and soldering or gold. They are formed on a plane which is opposite to the semiconductor element side of the base (insulating film) 2, and connected to the end portions 3b of the leads 3 through holes of the base 2.

Reference numeral 8 represents a reinforcing outer ring which surrounds the semiconductor element 4, and it is formed integrally with the outside of the main portion of the lead frame through suspending portions 10. It has a laminate structure comprising copper, aluminum, copper, nickel or the like. The suspending portions 10 are formed of the same layers as the leads 3, and thus they are formed of copper or nickel, for example. As compared with the prior art, the suspending portions 10 are designed to have a larger width. This is because reinforcing portions are formed on the suspending portions as described later.

Reference numeral 17 represents reinforcing portions provided on the suspending portions 10 and they are formed of the same material as the ball-shaped external terminals 6 for example, nickel and soldering or gold. The reinforcing portions 17 are provided to reinforce the suspending portions 10 and are formed simultaneously with formation of the external terminals 6.

As shown in FIGS. 3A and 3B, in the lead frame of this embodiment, the outer ring 8 is integrally formed on the outer portion of the main portion 15 of the lead frame through the suspending portions 10 on which the reinforcing portions 17 are provided. Therefore, when the lead frame 1 is merely mounted on the semiconductor element 4 to position the outer ring 8 to the semiconductor element 4 as shown in FIG. 4, the outer ring is positioned to the semiconductor device 4 without deforming the suspending portions 10.

Accordingly, there is no possibility that the suspending portions are broken and the circuit portion falls off, and the positional precision between the circuit portion and the outer ring is enhanced, so that no trouble occurs in the fabrication process.

Figure 4:
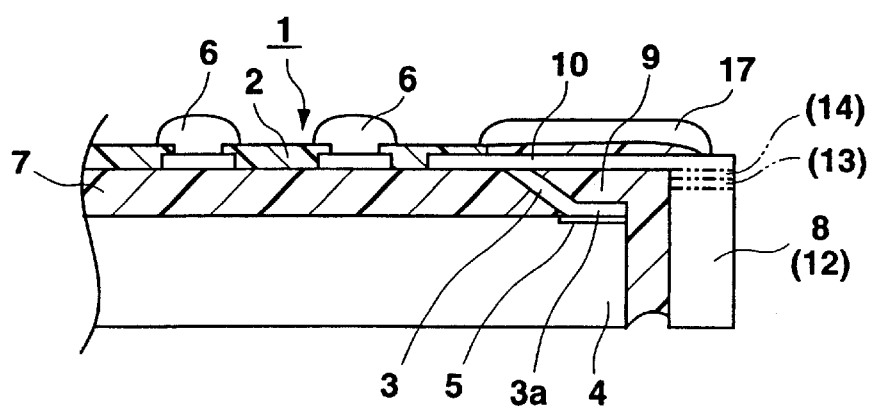
FIG. 4 is a cross-sectional view showing a semiconductor device in which a lead frame shown in FIGS. 3A and 3B is installed to a semiconductor device.

FIG. 4 is a cross-sectional view showing a semiconductor device in which the lead frame shown in FIGS. 3A and 3B is mounted on a semiconductor element. In FIG. 4, reference numeral 4 represents a semiconductor element (semiconductor chip, for example), reference numeral 5 represents electrode pads thereof, and reference numeral 7 represents a buffer formed of silicone grease or adhesive agent, for example, and it is interposed between the lead frame 1 and the semiconductor element 4. Reference numeral 9 represents sealing agent for sealing and fixing between the outer ring 8 and the semiconductor element 4 and between the outer ring 8 and the lead frame 1.

Next, the manufacturing method of the lead frame 1 according to the present invention will be described along the process order with reference to FIGS. 5A to 5H. The manufacturing method is an application of the lead frame manufacturing technique for using a metal laminate plate having a three-layer structure as a base and forming outer leads at one side while forming inner leads at the other side (the technique as introduced in Japanese Laid-open Patent Application No. Hei-7-211834, Japanese Laid-open Patent Application No. Hei-7-147364 uses the lead frame manufacturing technique), and it is characterized in that the leads 3 and the suspending portions 10 of the lead frame 1 are formed in place of the inner leads and the outer ring is formed in place of the outer leads.

Figure 5A:
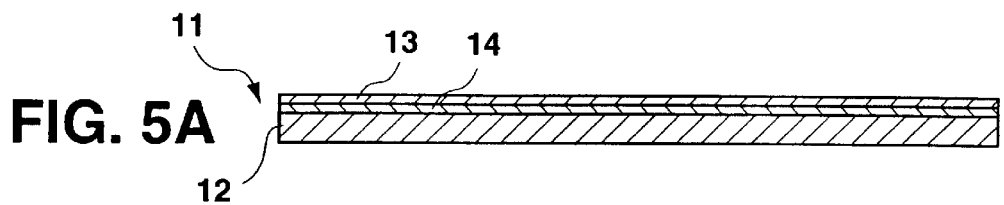
FIGS. 5A to 5H are cross-sectional views showing a manufacturing method of a semiconductor package according to the present invention in the process order.

(A) First, the metal laminate plate 11 having the three-layer structure is prepared as shown in FIG. 5A. The laminate plate 11 comprises a copper layer 12 of 150 micrometers in thickness which serves as the ring 8, an aluminum layer 13 of 3 micrometers in thickness which serves as an etching stopper, and a 2-micrometer plating base layer 14 of copper or nickel, which are overlaid on one another. In place of aluminum, nickel may be used for the etching stopper.

Figure 5B:
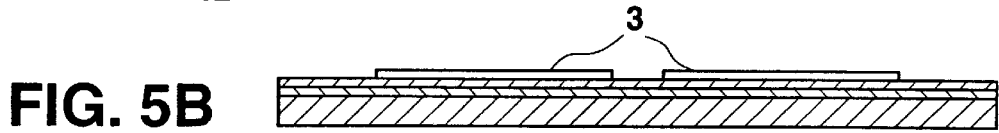

(B) Next, as shown in FIG. 5B, the leads 3 and the suspending portions 10 are formed on the plating back layer 14. The leads 3 and the suspending portions 10 are formed by coating a resist having a negative pattern to a pattern to be formed thereon, and plating the layer 14 as the base with copper (or nickel) (for example, plating thickness is set to 30 micrometers) by using the resist as a mask.

Figure 5C:
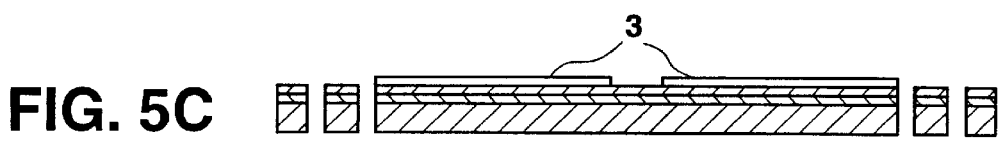

(C) Next, as shown in FIG. 5C, an etching is selectively performed on the metal laminate plate 11 from both the surfaces thereof so as to penetrate through the laminate plate 11, thereby forming a lead frame in which plural lead frames are integrally linked to one another.

Figure 5D:
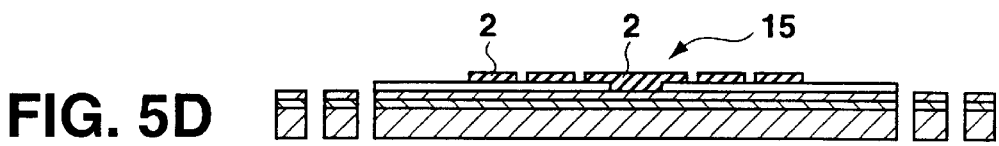

(D) Next, as shown in FIG. 5D, an insulating film 2 is selectively formed on the surface at the lead forming plane side of the laminate plate 11.

Figure 5E:
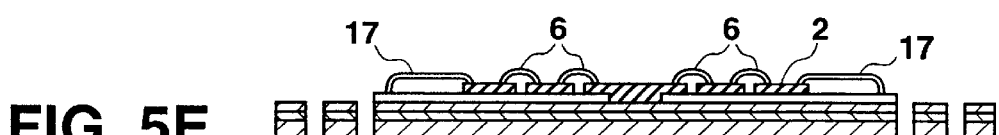

(E) Next, as shown in FIG. 5E, soldering balls 6 serving as the external terminals are formed on the surfaces of the leads 3 by using the insulating film 2 as a mask. At the same time, the reinforcing portions 17 for reinforcing the suspending portions 10 are formed on the suspending portions 10. The soldering balls 6 and the reinforcing portions 17 are formed by nickel plating (for example, the thickness is set to 80 micrometers) and soldering or gold plating (for example, the thickness is set to 30 micrometers).

Figure 5F:
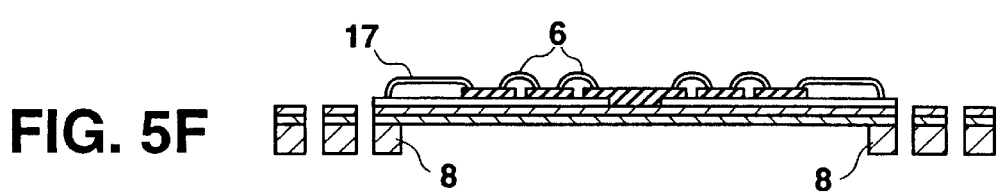

(F) Next, as shown in FIG. 5F, the thick copper layer located on the back surface side of the laminate plate 11 is subjected to a selective etching treatment to remove an inside portion thereof which is located inwardly from a portion 8 which will serve as the outer ring. In this step, the aluminum layer 13 remains except for the portion which is removed in the selective etching treatment of FIG. 5C.

Figure 5G:
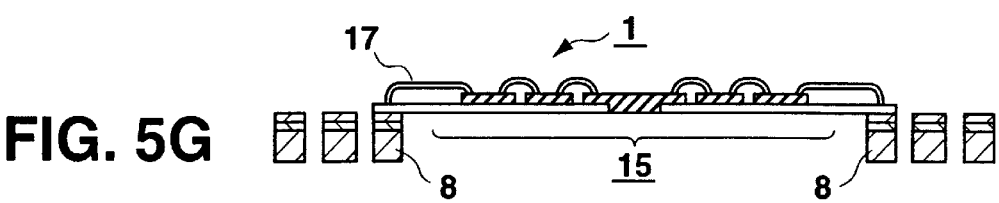

(G) Next, as shown in FIG. 5G, the plating base layer 14 serving as the base and the aluminum layer 13 serving as the etching stopper are etched by using the leads 3, 3, . . . and the suspending portions 10 (in FIG. 5, no suspending portion 10 appears) as a mask, whereby the leads 3 and the suspending portions are independent of one another, and at this stage are not electrically short-circuited to one another. Reference numeral 15 represents the main portion of the lead frame. The main portion 15 appears as being separated from the outer ring 8 in FIG. 5G. However, this is because the suspending portions 10 do not appear in the cross-sectional views of FIGS. 5A to 5H, and actually the main portion 15 is integrally linked to the outer ring 8 through the suspending portions 10.

Figure 5H:
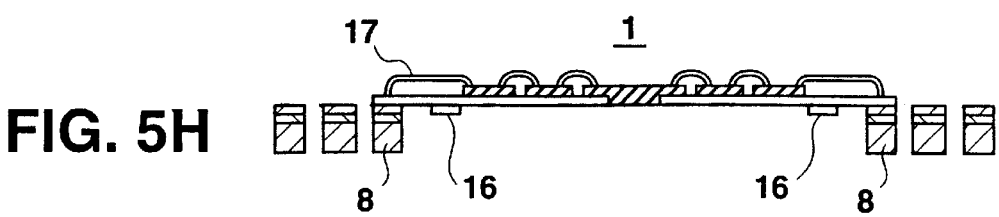

(H) Next, as shown in FIG. 5H, bumps 16 are formed at the end portions 3a of the respective leads 3 as necessary. In the case of the lead frame 1 shown in FIGS. 3A and 3B, no bump is provided, and thus this process is unnecessary. However, in a modification shown in FIG. 7 which will be described later, bumps are provided, and when a lead frame of the modification is manufactured, the bumps are formed in this process. There is also a case where the bumps are formed at the semiconductor element 4 side.

According to this method, by using the laminate metal plate of the three-layer structure as a base, the outer leads are formed at one side and the inner leads are formed at the other side, thus making it practice to manufacture the lead frame of the present invention.

In this embodiment, the leads are formed by growing the plating film by using as a mask the resist film which is selectively formed on the plating base film. However, the leads may be formed by forming the layer 14 of copper or nickel at a large thickness and patterning the layer 14 by the selective etching treatment.

FIGS. 6A to 6D show the installation of the lead frame 1 to the semiconductor element in the process order.

Figure 6A:
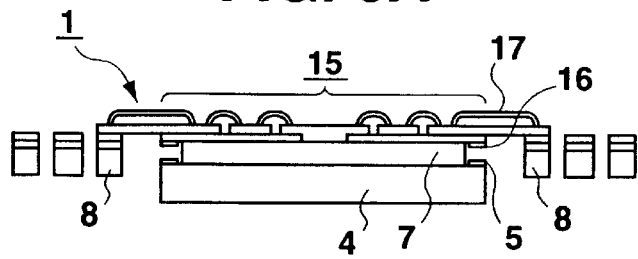
FIGS. 6A to 6D are cross-sectional views showing a method of mounting the lead frame of the present invention on the semiconductor element.

(A) First, the lead frames 1 in the lead frame shape are positioned to the semiconductor elements 4 arranged while buffer 7 is interposed therebetween as shown in FIG. 6A.

Figure 6B:
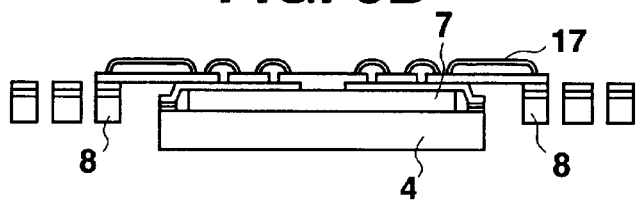

(B) Next, as shown in FIG. 6B, the tip portions 3a of the respective leads 3 are connected to the electrode pads 5 of the semiconductor element (chip) 4 by single point bonding, for example.

Figure 6C:
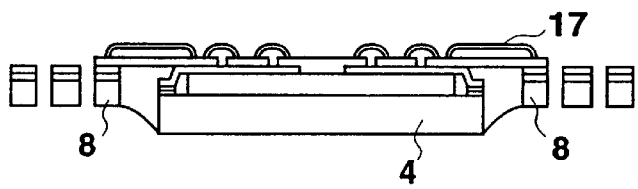

(C) Next, as shown in FIG. 6C, sealing agent 9 such as epoxy resin, silicone resin or the like is injected and sealed between the semiconductor element 4 and the lead frame 1/the outer ring 8 with a dispenser or the like by potting to fix the semiconductor element 4 and the lead frame 1/the outer ring 8.

Figure 6D:
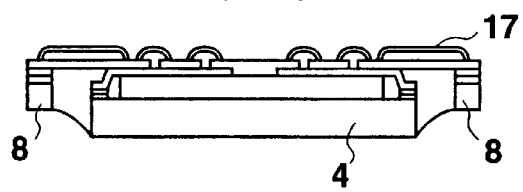

(D) Next, an undesired portion of the lead frame in which the plural lead frames 1 are integrally linked to one another is cut out to separate the lead frames 1 from one another as shown in FIG. 6D, thereby obtaining a semiconductor device which has the lead frame 1 as an intermediate circuit board and has the external terminals 6 of ball grid array shape connected to the respective electrodes of the semiconductor element 1 and the reinforcing portions 17 on the intermediate circuit board, and which is reinforced by the outer ring 8.

According to the fabrication method described above, the outer ring 8 is integrally formed with the lead frame 1 through the suspending portions 10 on which the reinforcing portions 17 are provided. Therefore, by positioning the lead frame 1 to the semiconductor element 4, the outer ring 8 is automatically positioned to the semiconductor element 4. In addition, the suspending portions 10 are not deformed.

Figure 7:
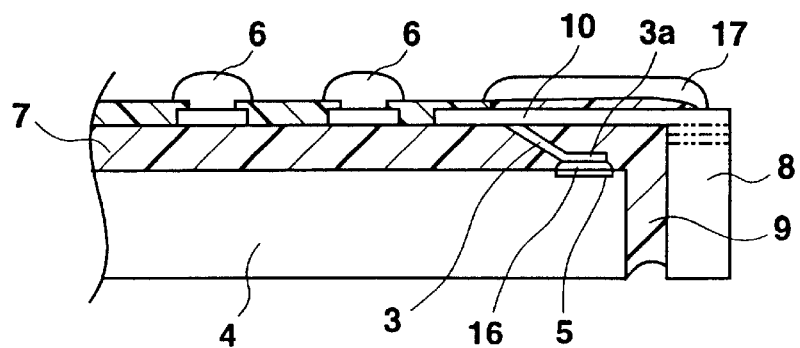
FIG. 7 is a cross-sectional view showing a modification of the lead frame shown in FIGS. 3A and 3B.
Figure 8:
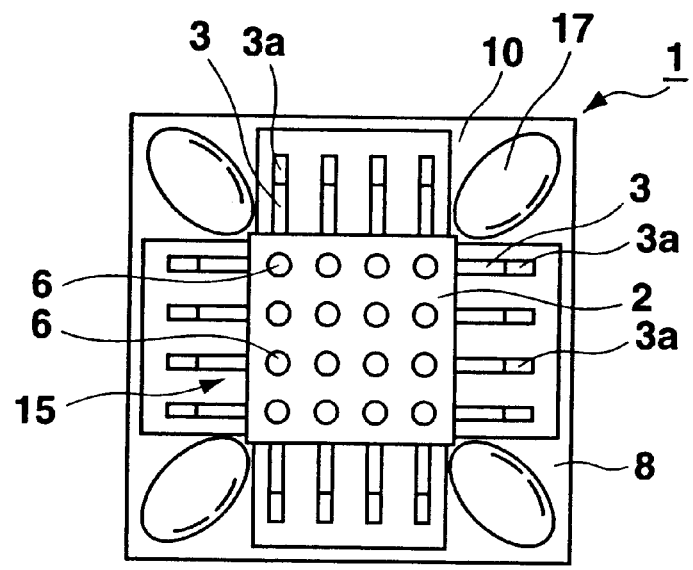
FIG. 8 is a plan view showing another modification of the lead frame shown in FIGS. 3A and 3B.

FIG. 7 is a cross-sectional view showing a modification of the lead frame shown in FIGS. 3A and 3B. This modification is different from the embodiment of FIGS. 3A and 3B merely in that the tip portions 3a of the respective leads 3 are bonded to the electrode pads 5 through metal bumps 16 formed on the semiconductor element 4.

The shape of the reinforcing portions 17 and the suspending portions 10 are not limited to the above ones. The suspending portions 10 may be formed not in a linear shape, but in a rectangular shape, and the reinforcing portions 17 each having a large area are formed to enhance the strength.

In the above-described embodiments, the suspending portions 10 are provided at the four corners of the lead frame 1, however, the present invention is not limited to this style. For example, the suspending portions may be provided at the intermediate portions between the sides.

According to the above embodiments, the reinforcing portions are provided on the suspending portions, and thus the suspending portions are reinforced, so that the deformation of the suspending portions can be prevented.

Accordingly, the suspending portions are not broken and the circuit portion does not fall off. Further, the positional precision between the circuit portion and the outer ring is enhanced, and thus no trouble occurs in the fabrication process.

Further, according to the above-described manufacturing method, the laminate plate of three or more layers is used as a base, and the ring is formed in place of outer leads by applying a lead frame forming technique of forming inner leads at one side and forming outer leads by the surface layer at the other side, and the reinforcing portions are formed simultaneously with the external terminals, thereby obtaining a lead frame with a ring. Therefore, the lead frame can be easily obtained by directly using the lead frame manufacturing technique which has been already developed.

Figure 9:
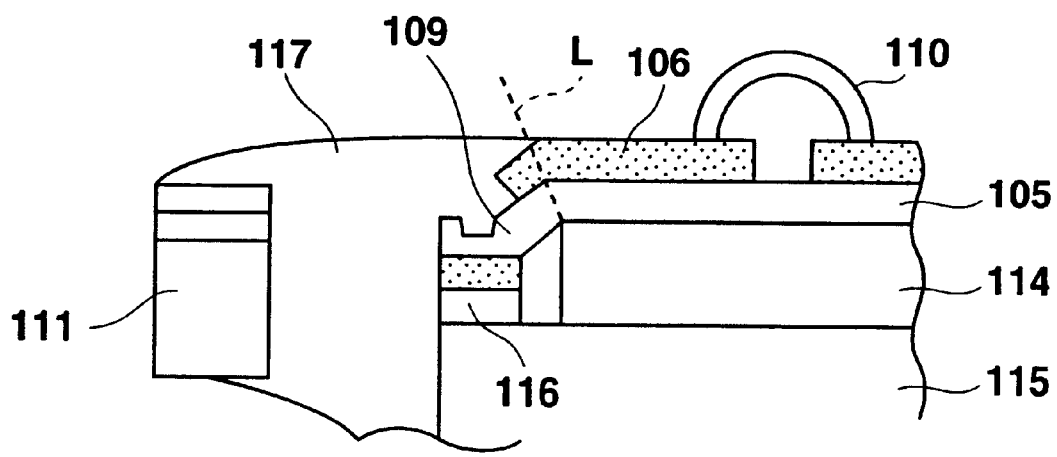
FIG. 9 is a partially enlarged view showing a semiconductor package having a super multiple pin structure.

When the super multiple pin structure as described above is implemented, the strength of the leads 109 themselves are necessarily weakened. Therefore, when a temperature cycle test or the like is performed, there is a case where a stress is applied to the bending position L of the lead 109 for which the edge of the adhesive layer 114 is used as a fulcrum as shown in FIG. 9, and thus the lead 109 is broken at that position.

The following embodiments can avoid the above drawback.

The embodiments of the lead frame and the semiconductor package will be described in detail together with the manufacturing procedure thereof with reference to the accompanying drawings.

First, in the manufacturing process of the lead frame, as shown in FIGS. 10A to 10H, a metal base 101 comprising a laminate plate having a three-layered structure is prepared. The metal base 101 is formed by forming an aluminum film 103 of about 4.5 $\mu$m in thickness on the surface of a substrate 102 of copper or copper alloy and about 150 $\mu$m in thickness (hereinafter referred to as copper substrate), for example, by the deposition method, and further forming a nickel film 104 of about 1 to 2 $\mu$m in thickness thereon.

The copper substrate 102 does not serve as leads, but it will be finally cut off excluding the portion corresponding to the outer ring (described later), however, it is indispensable to form a very fine lead pattern. The aluminum film 103 corresponds to an etching stop film to prevent the surface side of the metal base 101 from being etched when the copper substrate 102 is etched in the subsequent process. The nickel film 104 corresponds to the base for the electroplating to form the lead pattern on the surface of the metal base 101, that is, the plating base film.

As the metal base 101, a chrome film of about 0.5 $\mu$m in thickness may be formed as an adhering film between the aluminum film 103 and the nickel film 104 to enhance adherence between the aluminum film 103 and the nickel film 104. The plating base film may be formed as a thin film of copper in place of the nickel film 104.

Subsequently, as shown in FIG. 10B, plural lead patterns 105 of copper are formed on the surface of the metal base 101, that is, the surface of the nickel film 104 by the selective plating method. The selective plating is performed by selectively coating a resist pattern on the surface of the metal base 101, and then performing copper electroplating with the resist pattern as a mask.

In this process, the lead patterns 105 which are excellent in film quality and finely patterned can be obtained.

Subsequently, as shown in FIG. 10C, the metal base 101 is subjected to the selective etching from both the surfaces thereof to form slits S to define the outer shape of the lead frame every chip and holes (not shown) to facilitate the manufacturing process.

Subsequently, as shown in FIG. 10D, an insulating film 106 is laminated on the lead pattern 105 which is formed by the selective plating, thereby forming the wiring film 107 comprising the lead pattern 105 and the insulating film 106. The insulating film 106 is formed of photosensitive resin such as epoxy group, polyimide group, polyolefin group or the like, or polyimide film, and a number of holes 108 are formed on the film by selectively etching the insulating film 106.

Here, the plural leads 109 are extended from the wiring film 107 in correspondence with the extension of the previously-formed lead pattern 105. These leads 109 use the extension ends thereof, that is, the lead tips as the connection portions to the electrode pads of the semiconductor chip, and for the connection the respective leads 109 are bent while setting the boundary to a predetermined position L.

Therefore, in this embodiment, when the above insulating film 106 is laminated, the film lamination area is extended to the lead extension end side (lead tip side) beyond the lead bending position L as described above, whereby a part of the insulating film 106 is bent together with each lead 109 in the lead bending shaping process as described later.

It is better to set the extension dimension of the insulating film 106 from the lead bending position L to be large as possible as to the extent that it does not obstruct the lead bending shaping process as described above.

Subsequently, as shown in FIG. 10E, external connection terminals 110 comprising solder balls are formed at the termination of the lead patterns 105 coated with the insulating film 106 (just above the holes 108) by using the insulating film 106 as a mask. The external connection terminals 110 are obtained by forming a base film of metal material such as copper, nickel or gold at the termination of the lead patterns 105 exposed onto the insulating film 6 by an electroplating method or the like, laminating soldering material of tin-lead alloy on the base film by the electroplating method, and then reflowing the soldering material to shape the soldering material in a ball shape.

Subsequently, as shown in FIG. 10F, the copper substrate 102 of the metal base 101 is removed by the selective etching so that the outer ring 101 remains. In the etching process, the aluminum film 103 serves as an etching stopper, and only the copper substrate 102 is removed.

Subsequently, as shown in FIG. 10G, the aluminum film 103 of the metal base 101 is removed by the selective etching, and the nickel film 104 is removed by the selective etching to make the respective lead patterns 105 (containing the leads 109) separate from and independent of one another.

In the state of FIG. 10G, the wiring film 107 and the outer ring 111 are represented as being separated from each other. However, they are actually integrally linked to each other by suspending leads (not shown) which are formed simultaneously with the lead patterns 105.

Subsequently, as shown in FIG. 10H, a bump 112 of aluminum is formed at the tip of each lead 109 extending from the wiring film 107 by the sputtering method or the deposition method.

Through the above process, the lead frame 113 before semiconductor chips are assembled to the lead frame is completed.

Figure 11A:
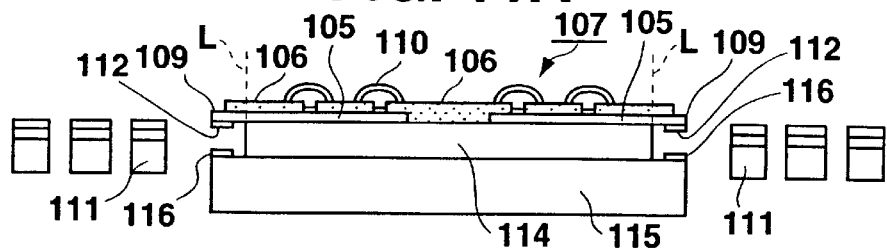
FIGS. 11A to 11D are cross-sectional views showing a process for manufacturing a semiconductor package according to another embodiment of the present invention.

Thereafter, when the semiconductor chip is assembled to the lead frame 113, the semiconductor chip 115 is positioned and fixed to the back surface side of the wiring film 107 through an adhesive layer 114 as shown in FIG. 11A. At this time, the tip portion (bump 112) of each lead 109 extending from the insulating film 106 is confronted to each of the electrode pads 116 on the semiconductor chip 115.

Figure 11B:
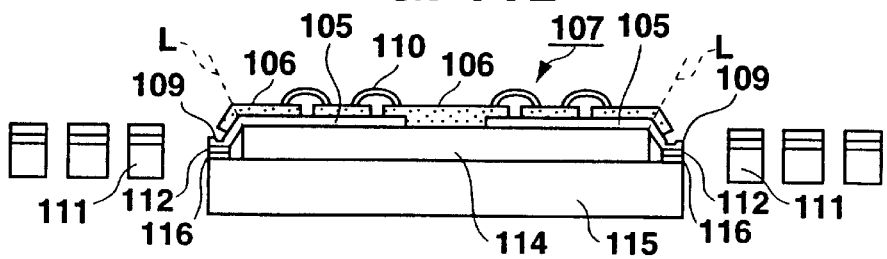

Subsequently, as shown in FIG. 11B, the tip portion of each lead 109 is bonded to the electrode pad 116 of the semiconductor chip 115 through the bump 112 by the single point bonding method. In the single point bonding method, each lead 109 is bent and shaped by a wedge tool (not shown) with the previously-described lead bending position at the boundary, and pushed against the electrode pads 116. At this time, in the structure of the lead frame 113, the laminate area of the insulating film 106 is extended to the lead tip side (lead extension end side) beyond the lead bending position L, whereby the lead bending position L is located inside of the film laminate area. Therefore, in the bending and shaping process of the leads 109 by the single point bonding method, a part of the insulating film 6 is bent together with each lead 109.

Figure 11C:
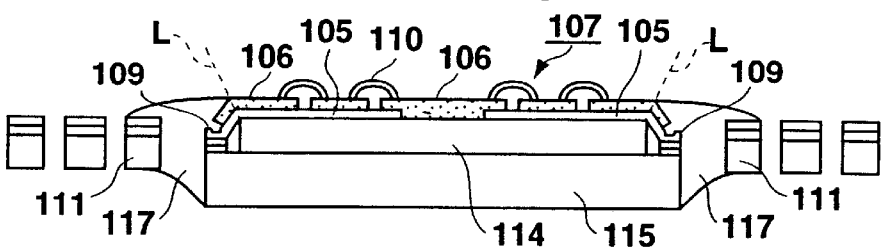

Subsequently, sealing resin 117 of epoxy resin, silicone resin or the like is injected into the peripheral area of the semiconductor chip 115 containing a boundary portion between each lead 109 and the insulating film 106 by the potting method as shown in FIG. 11C, and then hardened to integrate the respective constituent parts.

Figure 11D:
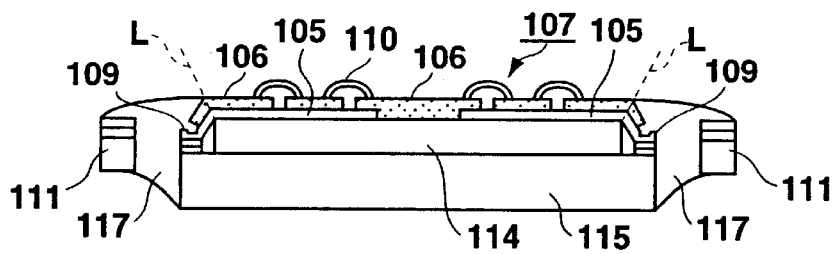

Finally, as shown in FIG. 11D, an undesired portion is cut off with the outer edge portion of the outer ring 111 at the boundary as shown in FIG. 11D, thereby completing the semiconductor package 118 having the super multiple pin structure.

Figure 12:
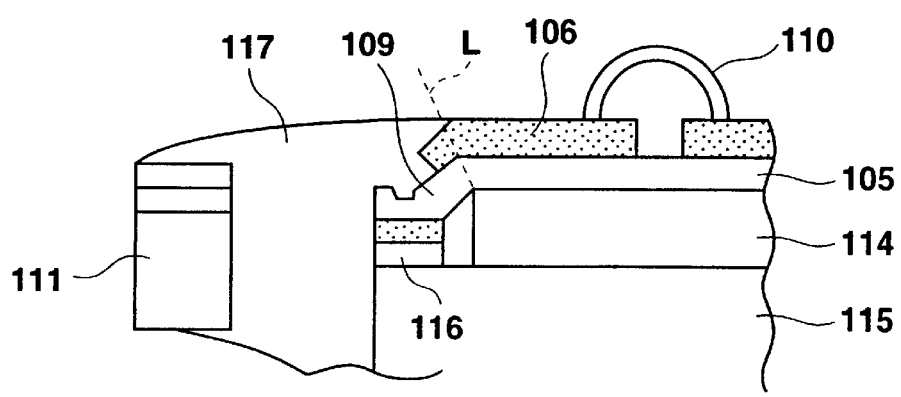
FIG. 12 is a partially enlarged view showing a semiconductor package according to an embodiment of present invention.

In the semiconductor package 118 thus obtained, as shown in FIG. 12, the bending position L of each lead 109 is reinforced by the insulating film 106, and also the reinforced portion is embedded in the sealing resin 117 integrally with the lead 109. Accordingly, the sufficient strength can be secured at the bending position L of the lead 109, and thus the breaking of the leads 109 can be prevented by the reinforcing effect of the insulating film even when an environmental stress is applied to the bending position L of each lead 109 due to the temperature cycle or the like.

Further, as another preferable embodiment, if a resin film (not shown) which is formed of resin material such as polyimide or the like which has high adherence to the insulating film 106 is formed (backed) at the opposite side to the insulating film 106 so that the lead pattern 105 (containing the base portion of the lead 109) is sandwiched between the resin film and the insulating film 106, the reinforcing effect at the base portions of the leads can be further enhanced, and the leads 109 and the insulating film 106 can be surely prevented from being exfoliated from each other even in the bending and shaping process of the leads 109.

In the above embodiment, there is described the structure of the wiring film 107 in which the lead patterns 105 are formed on the metal base 101 by the copper electroplating method, and then the insulating film 106 is laminated on the lead patterns 105. However, the present invention is not limited to the above structure. The present invention may be likewise applied to the structure in which the lead patterns are formed on the film base of polyimide or the like by etching.

According to the lead frame described above, when the plural leads extending from the wiring film are connected to the electrode pads of the semiconductor chip, a part of the insulating film is bent together with each lead, whereby the bending position of each lead is reinforced by the insulating film, and the strength of the leads can be enhanced.

Further, according to the semiconductor package described above, the bending positions of the plural leads extending from the wiring film are reinforced by the insulating film, and the reinforced portion is embedded integrally with the leads in the sealing resin. Therefore the sufficient strength can be secured at the lead bending position, so that the breaking of the leads due to the environmental stress can be surely prevented. As a result, the reliability of the semiconductor package to the environmental stress can be further enhanced.

In the semiconductor package as described above, the lead pattern is formed on the metal base by the copper electroplating at the manufacturing stage of the lead frame, and further the external connection terminals (solder balls) are formed on the lead pattern by the electroplating, thereby realizing the multiple pin structure which is beyond the hitherto limitation. Further, the metal base is selectively etched to leave the outer ring portion, and the outline of the package is formed by the outer ring, whereby the positional precision between the outline of the package and the external connection terminals is secured and thus the alignment when the package is mounted can be facilitated. Still further, so-called CSP (Chip Size Package) in which the package size is reduced to the same level as the chip size can be realized.

Here, in the manufacturing process of the semiconductor package, when the sealing resin is filled between the semiconductor chip and the outer ring, the resin is injected from the back surface of the chip. This is because if the resin is injected from the obverse surface of the chip, the following disadvantages would occur.

(1) Since the gap between the semiconductor chip and the outer ring is small (about 0.1 mm), it is difficult to fill the sealing resin between the semiconductor chip and the outer ring from the obverse surface of the chip.

(2) If the relative position between the package and the dispenser is deviated, the sealing resin would be attached to the external connection terminals (solder balls).

(3) The leads disturb the resin sealing work.

On the other hand, in the case where the resin is injected from the back surface of the chip, there is no part which disturbs the resin injection work, such as the leads and the external connection terminals, and also a sufficient amount of sealing resin can be supplied by using the step portion between the back surface of the chip and the outer ring. Therefore, the sealing resin can be smoothly filled between the semiconductor chip and the outer ring.

In the case of the semiconductor package, the sealing resin is filled between the semiconductor chip and the outer ring to integrate the peripheral parts. Therefore, in order to further reduce the package size, it is necessary to reduce the size (outside dimension) of the outer ring. However, if the size of the outer ring is reduced, the gap between the semiconductor chip and the outer ring is smaller by the amount of the reduction of the size, and thus it is difficult to inject the resin from the semiconductor chip. Accordingly, the size of the outer ring must be set to be large to the extent that the injection of the sealing resin is not difficult. This greatly obstructs the reduction of the package size.

The following embodiment can avoid the above drawback.

Figure 13A:
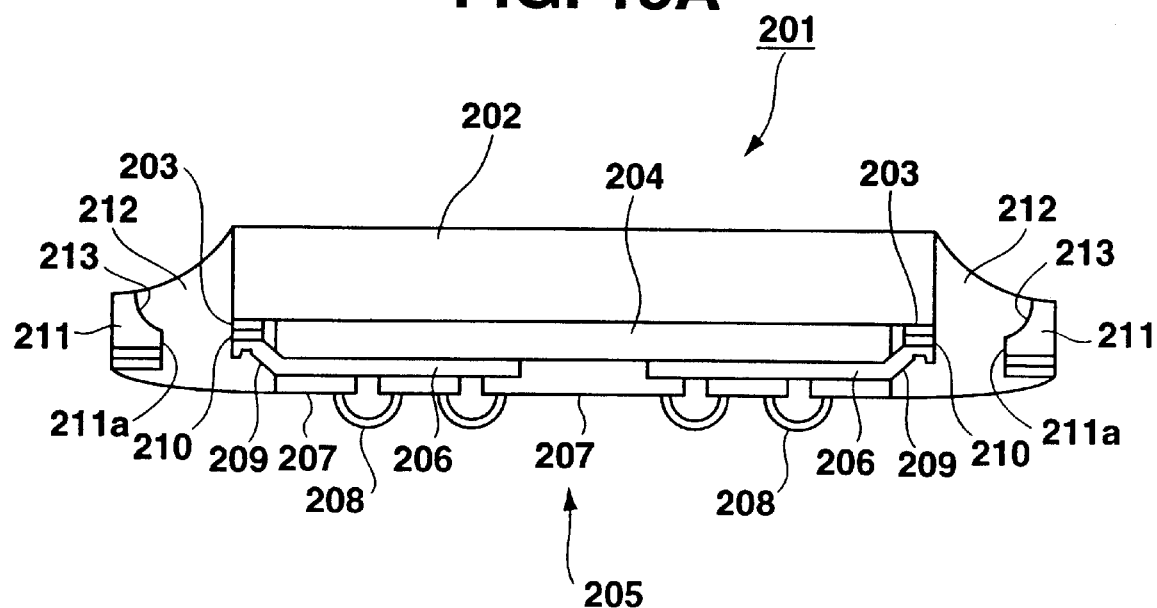
FIGS. 13A and 13B are cross-sectional views showing another embodiment of the semiconductor package according to the present invention.
Figure 13B:
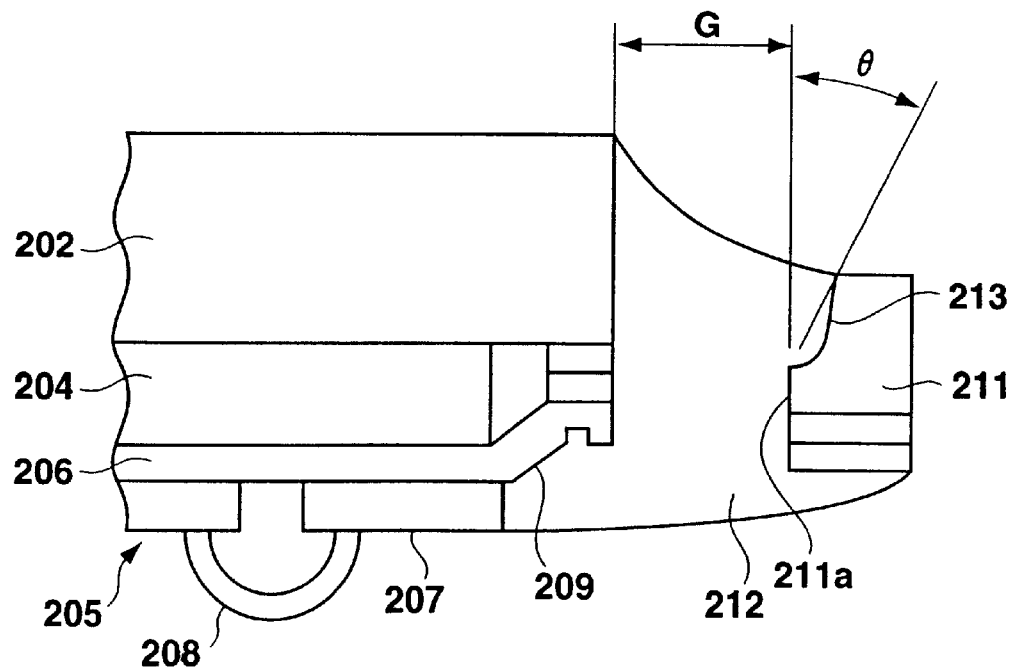

FIGS. 13A and 13B are side cross-sectional views showing this embodiment of a semiconductor package according to the present invention.

In the construction of the semiconductor package 101 shown in FIG. 13A, plural electrode pads 203 are formed along the peripheral edge portion on the surface of a semiconductor chip (the lower surface of the chip in FIG. 13A). Further, a wiring film 205 is disposed through an adhesive layer 204 formed of an adhesive sheet or the like at the center portion of the chip surface excluding a pad forming area. The wiring film 205 is constructed by laminating an insulating film 207 on a lead pattern 206. The adhesive layer 4 functions as a buffer for protecting an element forming area which exists inside of the pad forming area of the semiconductor chip 202, in addition to the function of adhesively attaching the semiconductor chip 202 and the wiring film 205.

The external connection terminals 208 comprising the solder balls are formed projectingly at the termination of the lead pattern 206 on the wiring film 205. Further, plural leads 209 are extended from the wiring film 205 in correspondence with the lead pattern 206, and the extension ends thereof are connected to the electrode pads 203 of the semiconductor chip 202 through the bumps 210. Further, an outer ring 11 is provided at the outside of the semiconductor chip 202 so as to surround the semiconductor chip 202. Sealing resin 212 is filled between the semiconductor chip 2 and the outer ring 211.

Here, an outwardly-opened open portion 213 is formed on the inner peripheral surface 211a of the outer ring 211 so as to be located at the back surface side of the semiconductor chip 202 (upper side in the figure). The open portion 213 is formed at an angle 0=30 to 245 degrees to the inner peripheral surface 211a of the ring. Therefore, the open portion 213 is to be larger at the back surface side of the chip than the gap G between the semiconductor chip 202 and the outer ring, so that the resin injection port can be kept broad to inject the sealing resin 212. Accordingly, the size (outside dimension) of the outer ring 211 can be reduced while the resin injection from the back surface side of the chip is facilitated.

Next, the manufacturing process of the semiconductor package 201 as described above will be described.

Figure 14A:
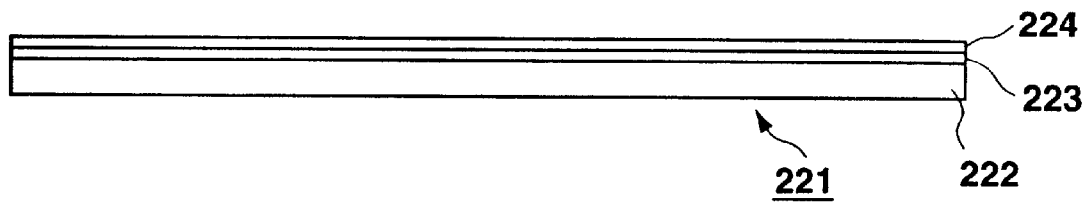
FIGS. 14A to 14D are cross-sectional views showing a process for manufacturing another embodiment of the lead frame.

First, in the manufacturing process of the lead frame, as shown in FIG. 14A, a metal base 221 comprising a laminate plate having a three-layered structure is prepared. The metal base 221 is formed by forming an aluminum film 223 of about 4.5 $\mu$m in thickness on the surface of a substrate 222 of copper or copper alloy and about 150 $\mu$m in thickness (hereinafter referred to as copper substrate) by deposition, and further forming a nickel film 224 of about 1 to 2 $\mu$m in thickness thereon.

The copper substrate 222 does not serve as leads, but it will be finally cut off excluding the portion corresponding to the outer ring (described later), however, it is indispensable to form a very fine lead pattern. The aluminum film 223 corresponds to an etching stop film to prevent the surface side of the metal base 221 from being etched when the copper substrate 222 is etched in the subsequent process. The nickel film 224 corresponds to the base for the electroplating to form the lead pattern on the surface of the metal base, that is, the plating base film.

As the metal base 221, a chrome film of about 0.5 $\mu$m in thickness may be formed as an adhering film between the aluminum film 223 and the nickel film 224 to enhance adherence between the aluminum film 223 and the nickel film 224. As the plating base film may be formed a thin film of copper in place of the nickel film 224.

Figure 14B:
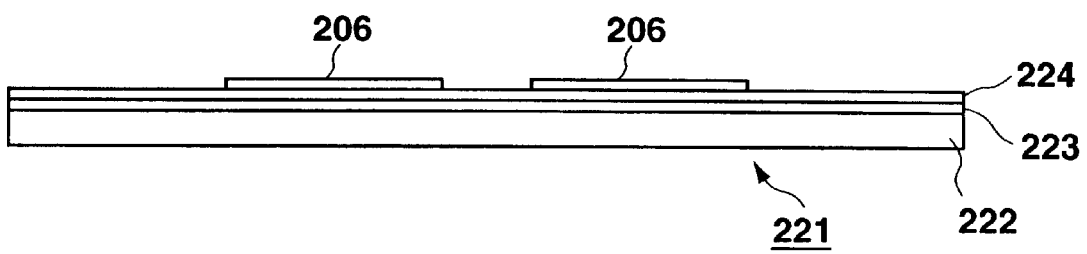

Subsequently, as shown in FIG. 14B, plural lead patterns 206 of copper are formed on the surface of the metal base 201, that is, the surface of the nickel film 204 by the selective plating method. The selective plating is performed by selectively coating a resist pattern (not shown) on the surface of the metal base 221, and then performing copper electroplating with the resist pattern as a mask.

In this process, lead patterns 206 which are excellent in film quality and finely patterned can be obtained.

Figure 14C:
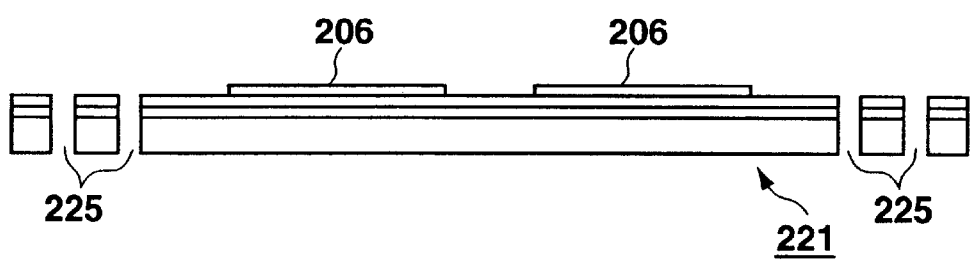

Subsequently, as shown in FIG. 14C, the metal base 221 is subjected to the selective etching from both the surfaces thereof to form slits 225 to define the outer shape of the lead frame every chip and holes (not shown) to facilitate the manufacturing process.

Figure 14D:
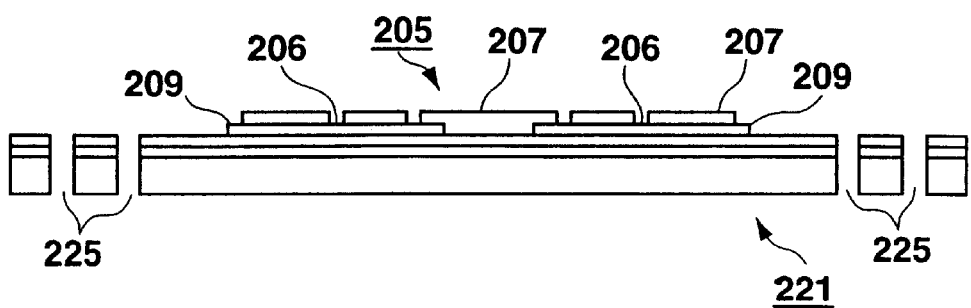

Subsequently, as shown in FIG. 14D, an insulating film 207 of a polyimide film for example is laminated on the lead pattern 206 which is formed by the selective plating, thereby forming the wiring film 205 comprising the lead pattern and the insulating film 207. At this time, the plural leads 209 are extended from the wiring film 205 in correspondence with the extension of the previously-formed lead pattern.

Figure 15A:
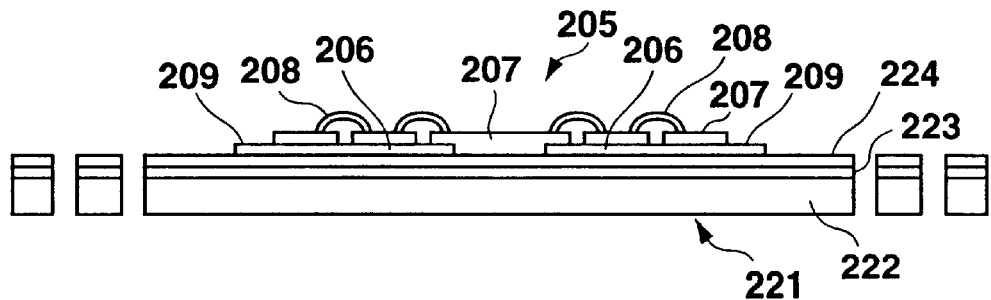
FIGS. 15A to 15D are cross-sectional views showing a subsequent process for manufacturing the lead frame of FIGS. 14A to 14D.

Subsequently, as shown in FIG. 15A, the external connection terminals 208 comprising the solder balls are formed at the termination of the lead pattern covered by the insulating film 207 by using the insulating film 207 as a mask. The external connection terminals 208 are formed by forming a nickel core of 80 μm at the termination of the lead pattern 208 exposed onto the insulating film 207 by the electroplating method, and coating soldering material of tin-lead alloy on the surface of the core by the electroplating method.

Figure 15B:
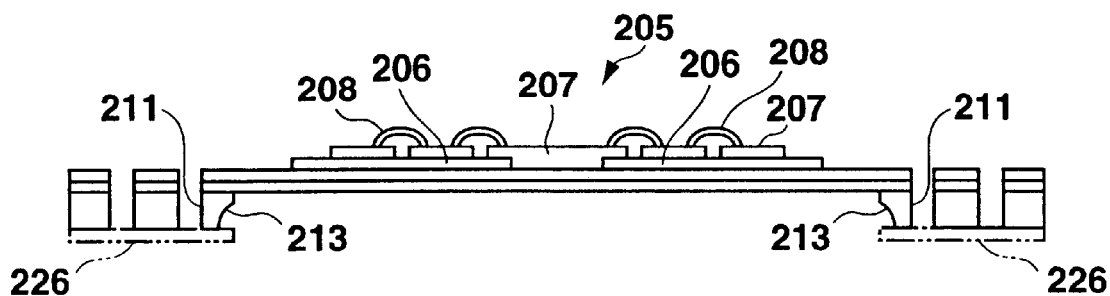

Subsequently, as shown in FIG. 15B, the metal base 221 is covered by the mask 226 and the copper substrate 222 of the metal base 221 is removed by the selective etching so that the outer ring 211 remains. In the etching process, the aluminum film 223 serves as an etching stopper, and only the copper substrate 222 is removed.

In this embodiment, when the copper substrate 222 is selectively etched, etching liquid of $H_2O_2$ (hydrogen peroxide)/$H_2SO_4$ (sulfuric acid) group is used. The concentration of $H_2O_2$ is set to 10% or less, and the etching liquid is sprayed onto the copper substrate 222 by a spray method, whereby the inner peripheral surface of the outer ring 211 is etched in a tapered shape (side-etching). In addition, since the tapered shape becomes remarkable in inverse proportion to the concentration of $H_2O_2$, an outwardly-opened open portion 213 can be formed at a desired size on the inner peripheral surface of the outer ring 211.

With respect to the tapered shape of the open portion 213, it can be adjusted on the basis of the temperature condition, the concentration of $H_2SO_4$, or the pressure of spray.

Figure 15C:
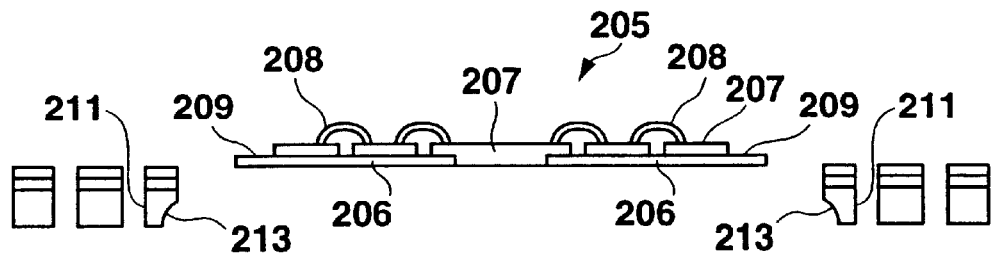

Subsequently, as shown in FIG. 15C, the aluminum film 223 of the metal base 221 is removed by the selective etching, and the nickel film 224 is removed by the selective etching to make the respective lead patterns 206 (containing the leads 209) separate from and independent of one another.

In the state shown in FIG. 15C, the wiring film 205 and the outer ring 211 are represented as being separated from each other, they are actually integrally formed with each other by the suspending leads (not shown) which are formed at the same time as the lead patterns 206.

Figure 15D:
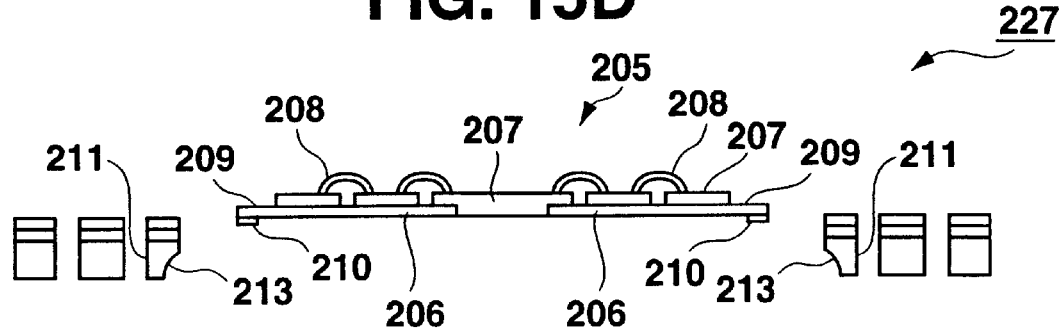

Subsequently, as shown in FIG. 15D, the bump 210 of aluminum is formed at the tip of each lead 209 extending from the wiring film 205 by a sputtering or deposition method, for example.

Through the above process, the lead frame 227 before the semiconductor chip is assembled to the lead frame is completed.

Figure 16A:
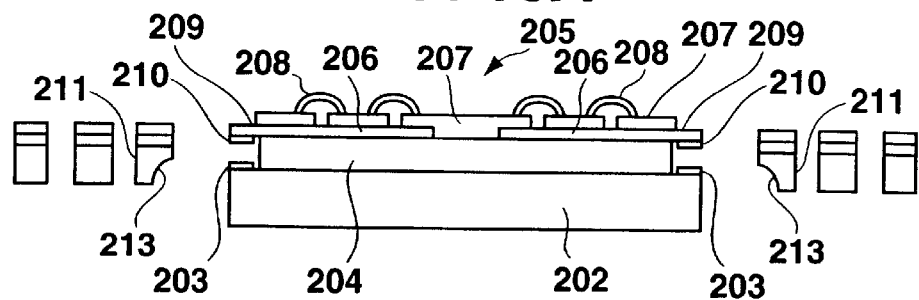
FIGS. 16A to 16D are cross-sectional views showing a method for manufacturing a semiconductor package having the lead frames shown in FIGS. 14A to 15D of the present invention.

Thereafter, when the semiconductor chip is assembled to the lead frame 227, the semiconductor chip 202 is positioned and fixed to the back surface side of the wiring film 205 through an adhesive layer 204 as shown in FIG. 16A. At this time, the tip portion (bump 210) of each lead 209 extending from the wiring film 205 is confronted to each of the electrode pads 203 on the semiconductor chip 202.

Figure 16B:
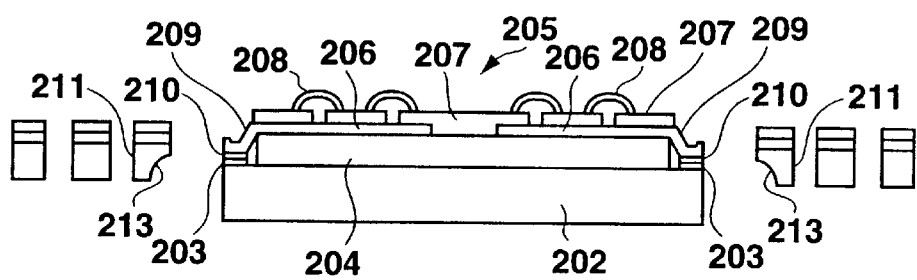

Subsequently, as shown in FIG. 16B, the tip portion of each lead 209 is bonded to the electrode pad 203 of the semiconductor chip 202 through the bump 210 by the single point bonding method.

Figure 16C:
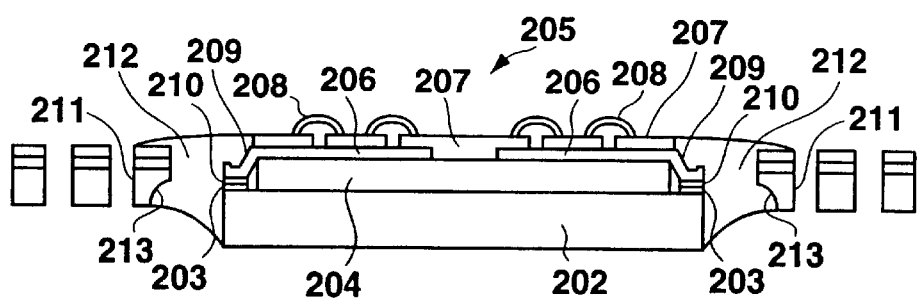

Subsequently, as shown in FIG. 16C, the sealing resin 212 such as epoxy resin, silicone resin or the like is injected from the back surface side of the chip into the gap between the semiconductor chip 202 and the outer ring 211 by the potting, and then hardened to integrate the respective constituent parts.

At this time, the outwardly-opened open portion 213 is formed on the inner peripheral surface of the outer ring 211, and thus the broad resin injection port is secured at the back surface side of the chip, so that the resin injection from the chip back surface side can be readily performed even when the gap between the semiconductor chip 2 and the outer ring 211 is small.

Figure 16D:
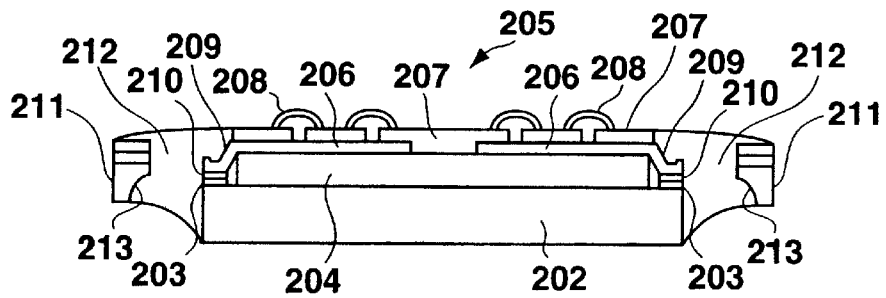

Finally, as shown in FIG. 16D, an undesired portion is cut out with the outer peripheral edge of the outer ring 211 at the boundary, thereby completing the semiconductor package 1 shown in FIGS. 13A and 13B.

In this embodiment, the outwardly-opened open portion 213 is formed at the chip back surface side and on the inner peripheral surface of the outer ring 211 which is provided to surround the semiconductor chip as described above. Therefore, the resin injection port at the chip back surface side can be kept broader. Accordingly, the size of the outer ring 211 can be reduced while the resin injection from the chip back surface side is facilitated.

Further, the provision of the open portion 213 enables the high-speed sealing between the semiconductor chip 202 and the outer ring 211 with a necessary and sufficient amount of sealing resin 212, whereby the sufficient strength at the outside portion of the package can be secured and the working efficiency of the resin injection can be enhanced.

As described above, according to the semiconductor package as described above, the outwardly-opened open portion is formed on the inner peripheral surface of the outer ring surrounding the semiconductor chip so as to be located at the chip back surface side. Therefore, the broad resin injection port for injecting the sealing resin can be secured at the chip back surface side between the semiconductor chip and the outer ring. Accordingly, the resin injection from the chip back surface side can be readily performed even when the size of the outer ring is reduced, and thus the package size can be reduced.

Further, according to the lead frame as described above, the outwardly-opened open portion is formed so as to be located at the chip back surface side on the inner peripheral surface of the open portion of the outer ring in which semiconductor chip can be accommodated. Therefore, when the semiconductor chip is accommodated in the open portion of the outer ring in the package fabrication process, the resin injection port at the chip back surface side can be kept broad, so that the package size can be reduced.

In the above-described semiconductor package, the wiring film is mounted onto the semiconductor chip through the adhesive sheet, and the external connection terminals are formed on the wiring film. Therefore, there is the following disadvantage.

That is, when the arrangement pitch of the external connection terminals is narrowed to the limit level, the number of external connection terminals which can be provided on the wiring film is restricted by the size of the semiconductor chip. Therefore, in order to reduce the chip size, the number of the external connection terminals must be reduced, resulting in obstructing the multiple pin structure.

The following embodiment can solve the above problem.

Figure 18:
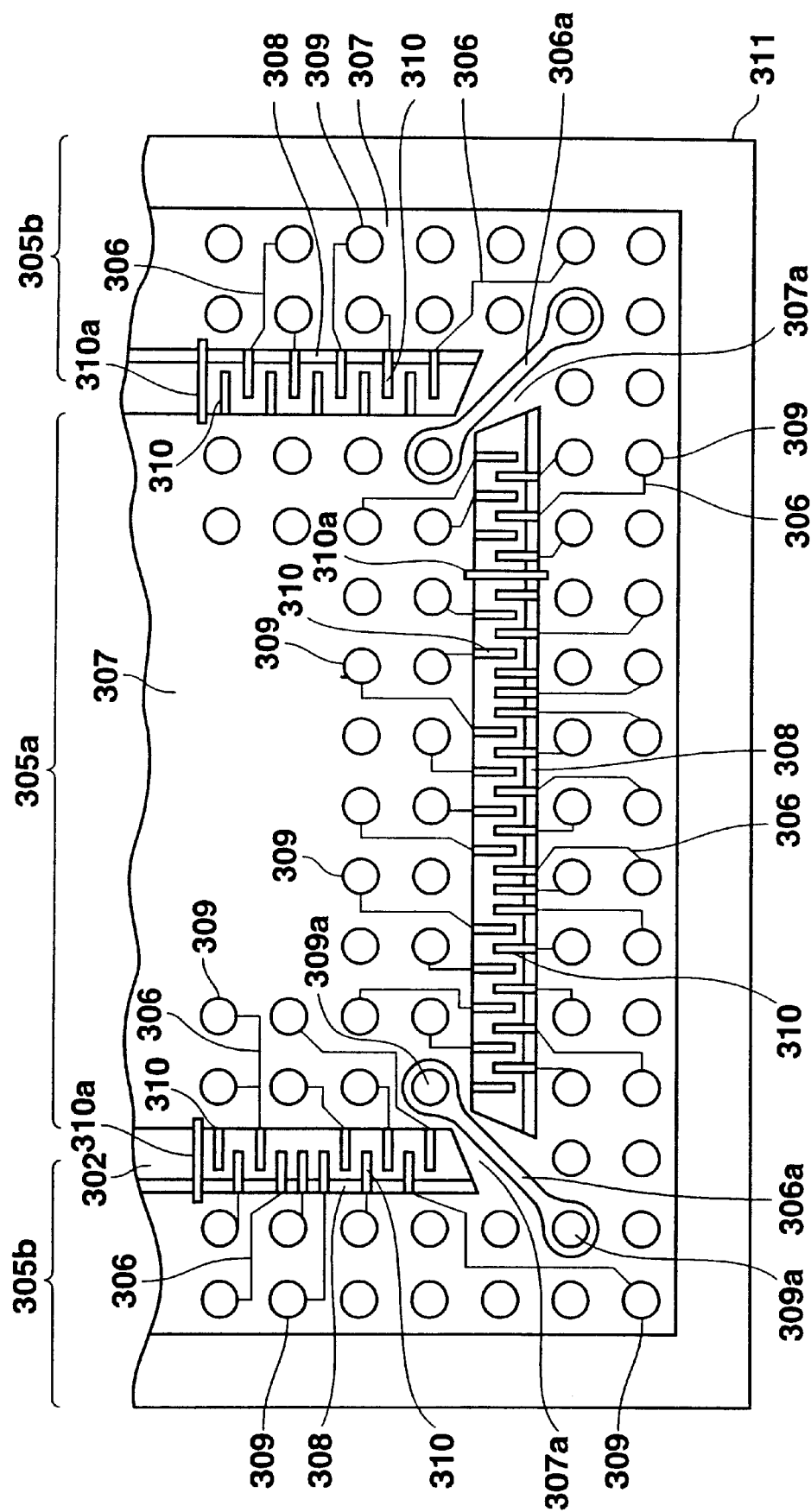
FIG. 18 is a bottom view of the main part of the embodiment of the semiconductor package according to the present invention.

FIG. 17 is a side cross-sectional view showing an embodiment of a semiconductor package according to the present invention, and FIG. 18 is a bottom view of the main part of the semiconductor package.

In the construction of a semiconductor package 301 shown in FIGS. 17 and 18, plural electrode pads 303 are formed over the peripheral edge portion on the surface of a semiconductor chip 302 (the lower surface of the chip in FIG. 17). Further, a wiring film 305 is formed and disposed at the surface side (pad forming surface side) of the semiconductor chip 302 through the adhesive sheet 304. The wiring film 305 is constructed by laminating an insulating film on a lead pattern 306. The outer dimension of the film is set to be larger than the outer dimension of the semiconductor chip 302. Further, film open portions 308 are provided along the peripheral edge portion of the chip in the wiring film 305. The film open portions 308 will serve as so-called bond holes to connect the tips of the leads to the electrode pads 303 of the semiconductor chip 302 as described later, and the film open portions 308 are formed in a slit shape so as to meet the pad arrangement on the semiconductor chip 302.

The adhesive sheet 304 comprises a thermoplastic polyimide adhesive sheet or polyolefine-based adhesive sheet of about 150 μm in thickness, and it serves not only to adhesively attach the semiconductor chip 302 and the wiring film 305, but also as a buffer member for protecting a device forming area which exists inside of the pad forming area of the semiconductor chip 302.

In the above-described wiring film 305, with the film open portion 308 at the boundary, the inside of the film open portion 308 is set as a first wiring area 305a while the outside of the film open portion 308 is set as a second wiring area 305b. The first wiring area 305a and the second wiring area 305b are linked to each other at the butt portions of the respective film open portions 308. That is, as shown in FIG. 18, the butt portion of each film open portion 308 is suspended by a part 307a of the insulating film 307, and the suspended portion is bridged by a suspending lead 306a for reinforcing the suspended portion. Further, plural external connection terminals 309 are formed from the first wiring area 305a to the second wiring area 305b on the wiring film 305. Each external connection terminal 309 is located at the termination (land) of the lead pattern 306 as described above, and projected in a ball shape for example. Dummy ball-shaped projections 309a having the same structure as the external connection terminals 309 are provided at both ends of the suspending leads 306a described above, and both the end portions of the suspending leads 306a are fixed to the insulating film 307 by the rivet action of the ball-shaped projections 309a.

Further, plural leads 310 are extended from the first wiring area 305a and the second wiring area 305b toward the film open portions 308. These leads 310 correspond to the lead patterns 306 formed in the first and second wiring areas 305a, 305b. The leads 10 are extended from the first wiring area 305a toward the outside of the package, and also are extended from the second wiring area 305a toward the inside of the package. The extension end (tip) of each lead 10 is connected to each electrode pad 303 formed on the semiconductor chip 302. Further, in addition to the above leads 310, support leads 310a (FIG. 18) which do not contribute to the circuit connection are bridged as dummies at suitable places of each film open portion 308. The support leads 310a are used to link and support the first wiring area 305a and the second wiring area 305b like the suspending leads 306a.

Further, an outer ring 311 is provided at the outside of the semiconductor chip 302 so as to surround the semiconductor chip 302. The outer ring 311 is formed in a ring shape along the peripheral edge of the wiring film 305 (second wiring area 305b) to thereby the outer shape of the semiconductor package 301. Further, sealing resin 312 of epoxy-based or silicone-based sealing resin 312 is filled between the semiconductor chip 302 and the outer ring 311, and the peripheral parts are integrally fixed to one another by the sealing resin 312.

An adhesive sheet 304 which is of the same type as the adhesive sheet 304 is attached to the second wiring area 305b of the wiring film 305. The adhesive sheet 304a is used to moderate an environmental stress (mainly, thermal stress) when and after the package is mounted on a print board (not shown), and it may be suitably provided in consideration of flexibility, etc. of the sealing resin 312 to the environmental stress.

Next, a series of manufacturing processes of the semiconductor package according to this embodiment will be described with reference to FIGS. 19A to 21D.

Figure 19A:
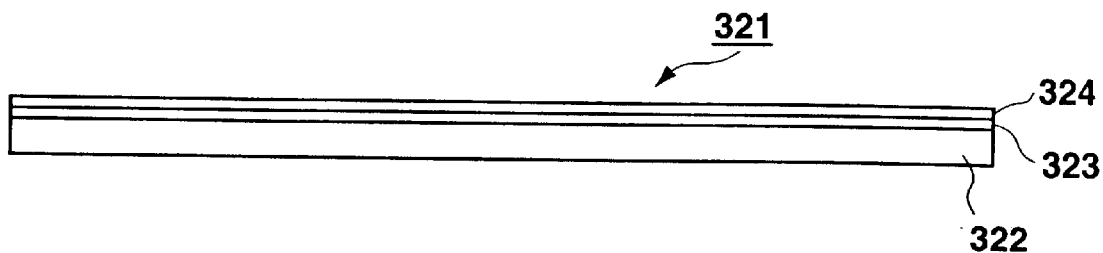
FIGS. 19A to 19D are cross-sectional views showing a process of manufacturing another embodiment of the lead frame of the present invention.

First, in the manufacturing process of a lead frame, a metal base 321 comprising a laminate plate of three-layered structure is prepared as shown in FIG. 19A. The metal base 321 is formed by forming an aluminum film 323 of about 4.5 μm in thickness on the surface of a substrate 322 of copper or copper alloy and about 150 μm in thickness (hereinafter referred to as copper substrate) by deposition, and further forming a nickel film 324 of about 1 to 2 μm in thickness thereon.

The copper substrate 322 does not serve as leads, but it will be finally cut off excluding the portion corresponding to the outer ring (described later), however, it is indispensable to form a very fine lead pattern. The aluminum film 323 corresponds to an etching stop film to prevent the surface side of the metal base 321 from being etched when the copper substrate 322 is etched in the subsequent process. The nickel film 324 corresponds to the base for the electroplating to form the lead pattern on the surface of the metal base, that is, the plating base film.

As the metal base 321, a chrome film of about 0.5 μm in thickness may be formed as an adhering film between the aluminum film 323 and the nickel film 324 to enhance adherence between the aluminum film 323 and the nickel film 324. As the plating base film may be formed a thin film of copper in place of the nickel film 324.

Figure 19B:
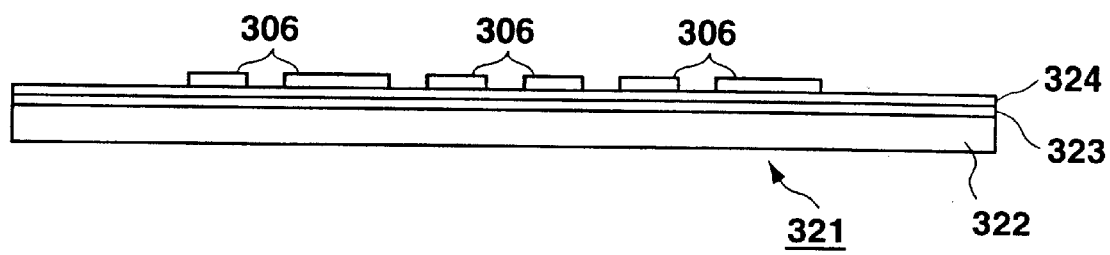

Subsequently, as shown in FIG. 19B, plural lead patterns 306 of copper 20 to 30 μm in thickness are formed on the surface of the metal base 321, that is, the surface of the nickel film 304 by the selective plating method. The selective plating is performed by selectively coating a resist pattern (not shown) on the surface of the metal base 321, and then performing copper electroplating with the resist pattern as a mask. At this time, the forming area of the lead pattern 306 which uses the resist pattern as a mask is set to be larger than the joint area of the semiconductor chip 302 as described later. When the lead pattern 306 is formed, the suspending lead 306a and the support lead 310 shown in FIG. 18 are formed at the same time.

Figure 19C:
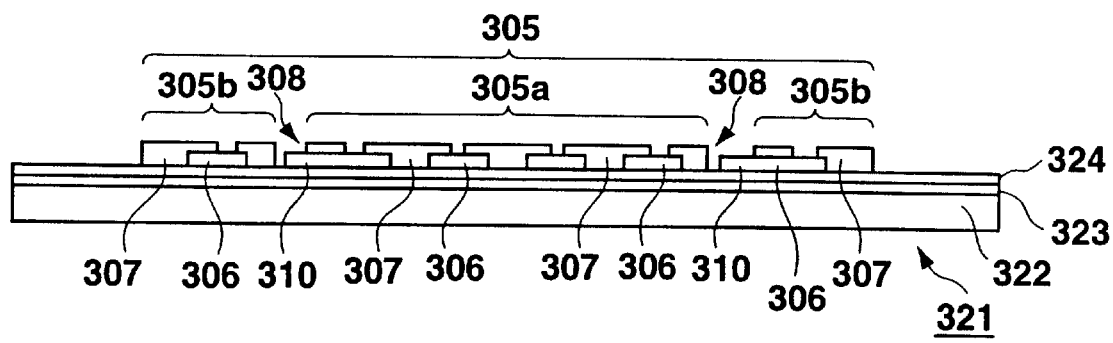

Next, as shown in FIG. 19C, the wiring film 305 comprising the lead pattern 306 and the insulating film 307 is formed by laminating an insulating film 307 of polyimide and about 25 μm in thickness on the lead pattern 306 which is formed by the copper electroplating. The insulating film 307 is patterned by using a well-known lithography technique to form small holes to form the external connection holes 309 by the plating method and also the film open portions 308 for lead bond. At this time point, the wiring film is divided into the first wiring area 305a and the second wiring area 305b, and the plural leads 310 are extended from the respective areas 305a, 305b to the film open portions 308.

Figure 19D:
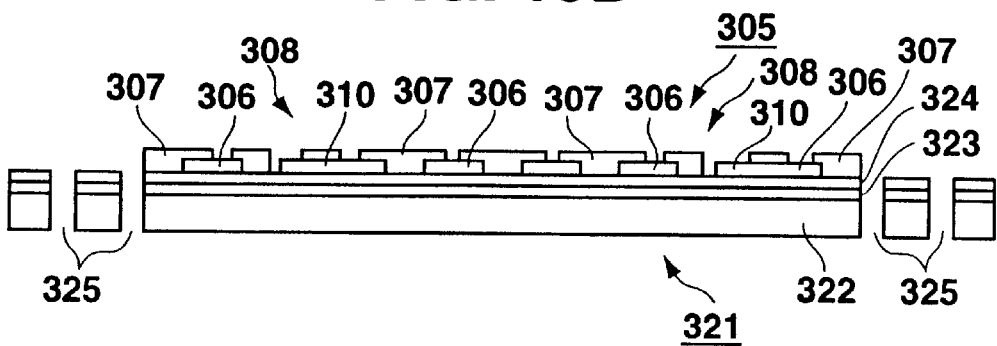

Subsequently, as shown in FIG. 19D, the metal base 321 is selectively etched from both surfaces thereof to form slits 325 for defining the outer shape of the lead frame for each chip and holes (not shown) for facilitating the manufacturing process.

Figure 20A:
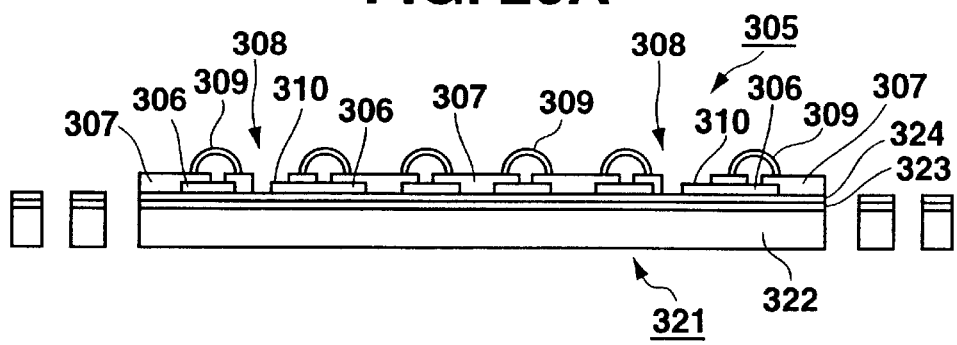
FIGS. 20A to 20D are cross-sectional views showing a subsequent process of manufacturing the lead frame of the embodiment.

Subsequently, as shown in FIG. 20A, the ball-shaped external connection terminals 309 are formed at the termination of the lead patterns 306 covered by the insulating film 307 by using the insulating film 307 as a mask. The external connection terminals 309 are obtained by forming a nickel core of about 90 μm at the termination of the lead pattern 306 exposed onto the insulating film 307 by the electroplating method and then subjecting the core surface to the gold plating treatment of 0.1 μm, or by forming a nickel core of about 80 μm by the electroplating method and then subjecting the core surface to the solder plating of about 20 μm.

Figure 20B:
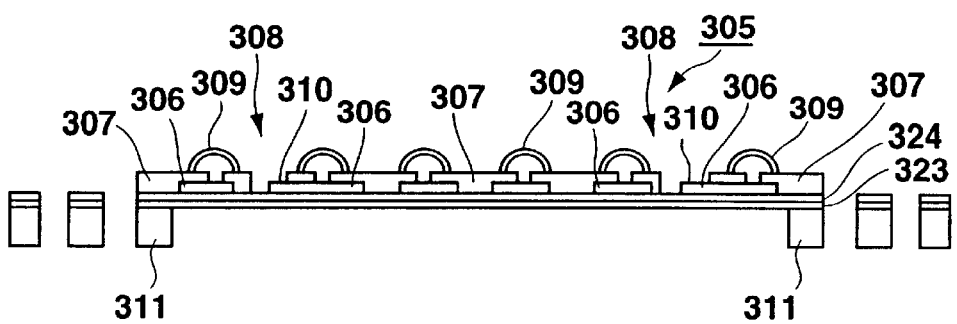

Subsequently, as shown in FIG. 20B, the copper substrate 322 of the metal base 321 is removed by the selective etching so that the portion corresponding to the outer ring 311 remains. In the etching process, the aluminum film 323 acts as an etching stopper, and only the copper substrate 322 is removed.

Figure 20C:
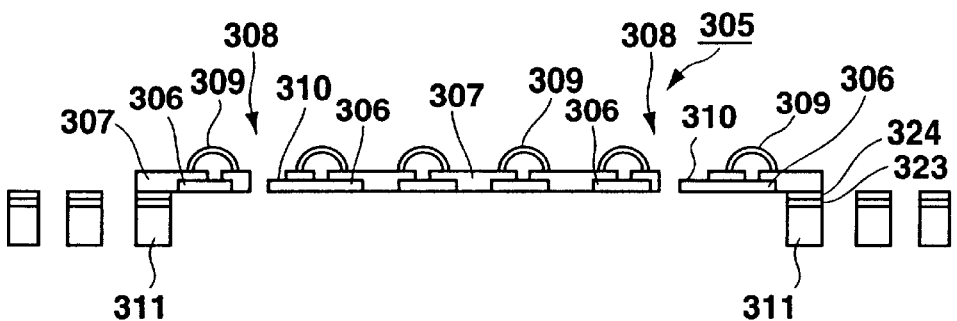

Next, as shown in FIG. 20C, the aluminum film 323 of the metal base 321 is removed by the selective etching, and the nickel film 324 is removed by the selectively etching to make the respective lead patterns 306 (containing the leads 319) separate from and independent of one another.

Figure 20D:
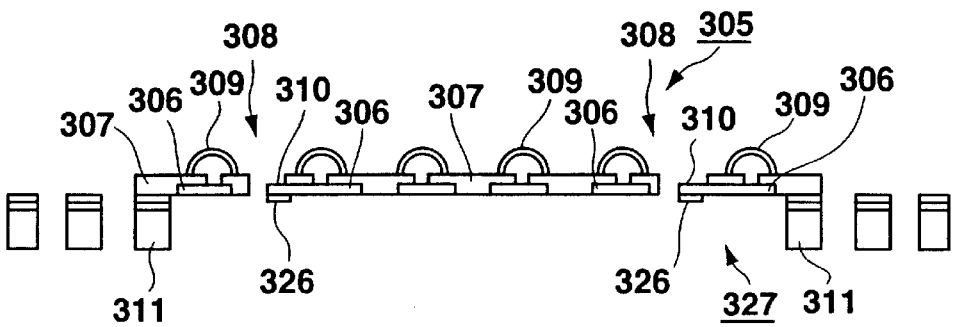

Subsequently, as shown in FIG. 20D, a bump 326 of aluminum is formed at the tip of each of the leads 310 extending from the first, second wiring areas 305a, 305b of the wiring film 305 by the sputtering method or the deposition method, for example.

Through the above process, the lead frame 327 before a semiconductor chip is assembled thereto is completed.

Figure 21A:
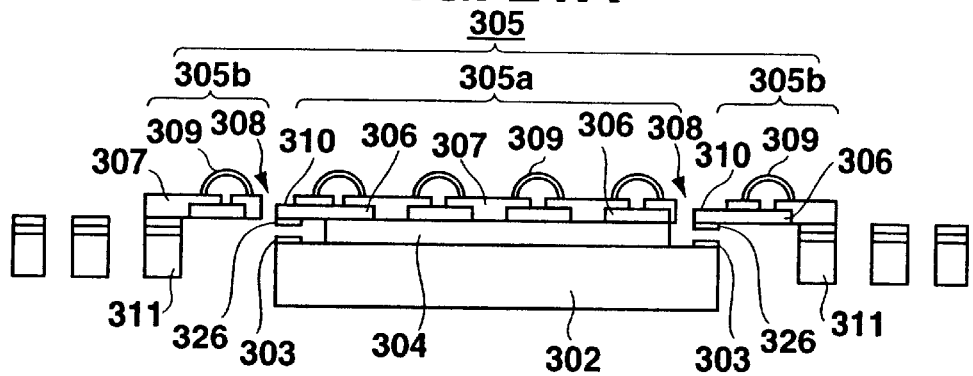
FIGS. 21A to 21D are cross-sectional views showing a process for manufacturing the semiconductor package having the lead frame of FIGS. 19A to 20D.

Thereafter, when the semiconductor chip is assembled to the lead frame 327, as shown in FIG. 21A, the semiconductor chip 302 is positioned and fixed to the back surface side of the wiring film 305 (first wiring area 305a) through the adhesive sheet 304. At this time, the first wiring area 305a of the wiring film 305 is disposed on the semiconductor chip 302, and the second wiring area 305b is disposed at the peripheral portion of the chip. Further, the tips (bumps 326) of the respective leads 310 extending from the first, second wiring areas 305a, 305b are confronted to the electrode pads 303 on the semiconductor chip 302.

Figure 21B:
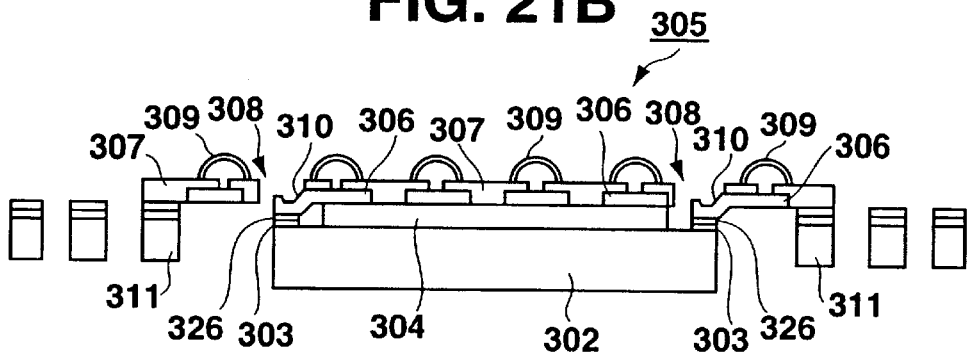

Subsequently, as shown in FIG. 21B, the tips of the respective leads 310 are connected to the electrode pads 303 of the semiconductor chips through the bumps 326 by the single point bonding. The single point bonding is performed through the film open portions 308 of the wiring film 305.

Figure 21C:
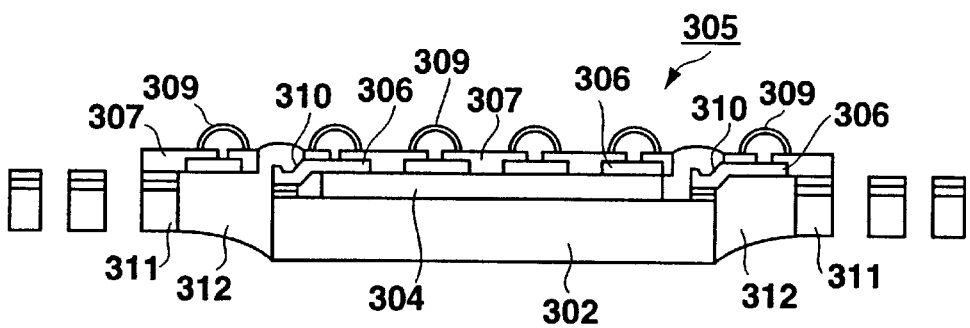

Subsequently, as shown in FIG. 21C, the sealing resin 312 of epoxy group or silicone group is injected between the semiconductor chip 302 and the outer ring 311 by the potting, and then hardened to integrate the peripheral parts.

Figure 21D:
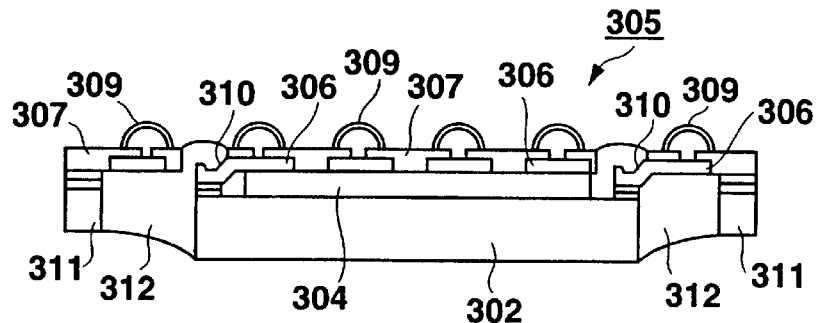

Finally, as shown in FIG. 21D, an undesired portion is cut out with the outer peripheral edge of the outer ring 311 at the boundary, thereby completing the semiconductor package 301 shown in FIG. 17.

As described above, in the semiconductor package 301 of this embodiment, the wiring area of the wiring film 305 is extended to not only the first wiring area 305a disposed on the semiconductor chip 302, but also the second wiring area 305b disposed at the peripheral portion of the chip, and the external connection terminals 309 are formed over the respective the wiring areas 305a, 305b, so that the number of the external connection terminals 309 is not restricted by the chip size. Accordingly, the size of the semiconductor chip 302 can be reduced without reducing the number of external connection terminals 309.

The arrangement of the external connection terminals 309 in the second wiring area may be freely set in conformity with the desired number of terminals. However, when the terminal arrangement is enlarged, the second wiring area 305b is also enlarged. Therefore, there is such a fear that the flexure or waving of the film becomes remarkable and thus the external connection terminals 309 are not aligned in height.

Another embodiment of the present invention which is implemented to overcome the above fear will be described hereunder.

Figure 22:
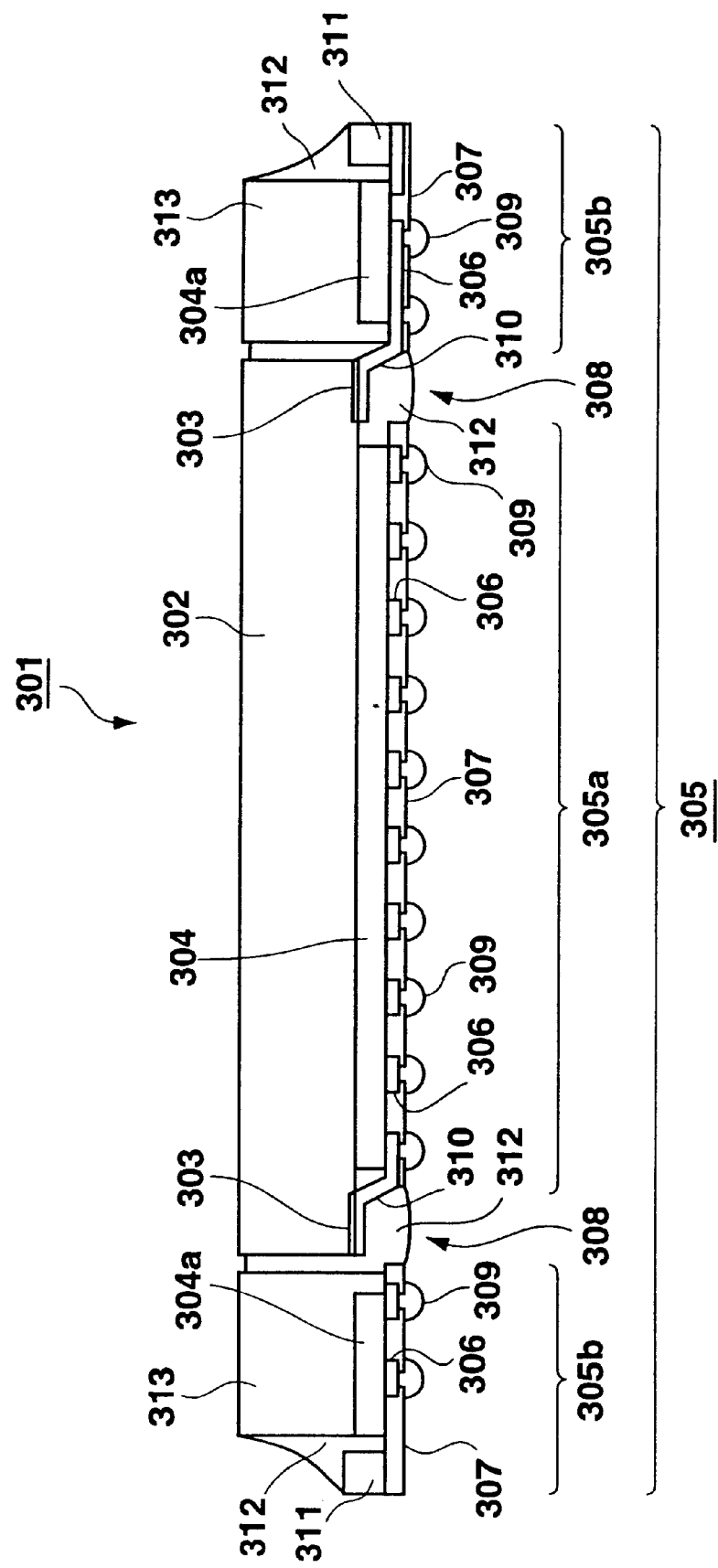
FIG. 22 is a cross-sectional view showing another embodiment of the semiconductor package according to the present invention.

FIG. 22 is a side cross-sectional view showing another embodiment of the semiconductor package according to the present invention. In the semiconductor package 301 shown in FIG. 22, a reinforcing plate 313 is attached to the second wiring area 305b of the wiring film 305 through an adhesive sheet 304a. The reinforcing plate 313 is formed of metal material such as aluminum or the like, and it is installed between the semiconductor chip 302 and the outer ring 311. The adhesive sheets 304, 304a are designed to have the same thickness, and the adhesive chips 302 and the reinforcing plate 313 are designed to have the same thickness so that the back surface (upper surface in FIG. 22) of the reinforcing plate 313 and the back surface of the chip are located in one plane. The sealing resin 312 is filled inside and outside of the reinforcing plate 313 between the semiconductor chip 302 and the outer ring 311.

In the semiconductor package 301, since the second wiring area 305b located at the peripheral portion of the chip is supported by the reinforcing plate 313, the flexure and the waving of the film in the second wiring area 305b can be suppressed. Accordingly, even when the terminal arrangement is enlarged in the second wiring area 305b, the external connection terminals 309 on the wiring film 305 can be kept uniform in height. Further, the back surface of the reinforcing plate 313 and the back surface of the chip are located in one plane. Therefore, in the package fabrication work, the external connection terminals 309 on the wiring film 305 can be aligned in height uniformly and precisely by a simple work of mounting the semiconductor chip 302 and the reinforcing plate 313 on the same reference plane and then attaching the wiring film 305 through the adhesive sheets 304, 304a from the upper side.

Figure 23:
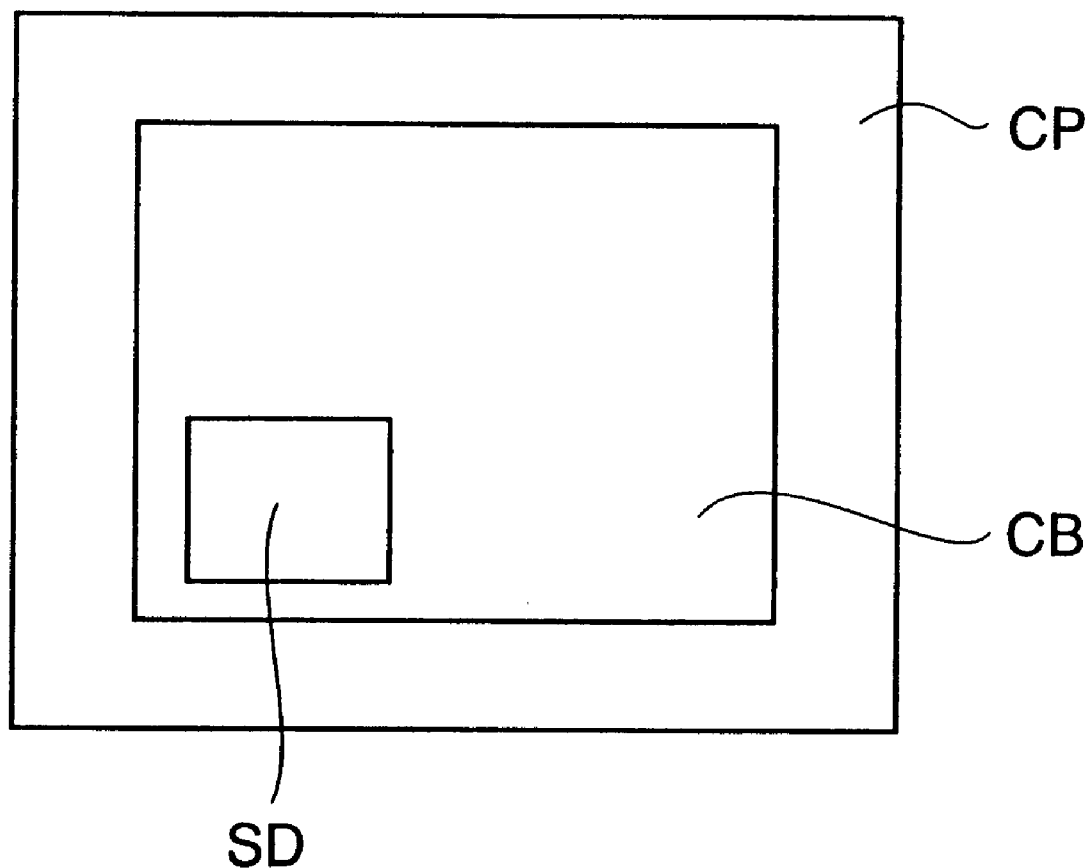
FIG. 23 shows a cellular phone in which a semiconductor device on a circuit board is installed.

FIG. 23 shows a cellular phone CP in which such a semiconductor device SD on a circuit board CB as described above is installed. As described above, according to the semiconductor devices of the above-described embodiments, the packaging size can be reduced, and thus the cellular phone itself in which the semiconductor device of the present invention is installed can be miniaturized. Accordingly, the present invention is very suitably applied to such a case that the semiconductor device of the present invention is installed into electronic equipment to which the miniaturization of the cellular phone, etc. is a significant challenge.

The present invention is not limited to a case where the lead pattern is formed by the copper electroplating as described above, and it is likewise applicable to another case where copper foil is attached onto an insulating film of polyimide or the like and then etched to form a lead pattern.

According to the above-described embodiment, the wiring area of the wiring film (the area for forming the external connection terminals) is extended to the second wiring area disposed at the peripheral portion of the chip in addition to the first wiring area disposed on the semiconductor chip. Therefore, the chip size can be reduced without reducing the number of external connection terminals. Accordingly, this embodiment can sufficiently follow the future ultra miniaturization of semiconductor chips. In addition, the number of external connection terminals can be increased without increasing the size of the semiconductor chips, and thus this embodiment is effective to further enhance the multiple pin structure.

In all the above-described embodiments, the etching stopper layer is formed of aluminum. However, nickel may be used in place of aluminum. Further, as described above, the plating back layer may be formed of copper or nickel in all the above-described embodiments.

What is claimed is:

1. A method for manufacturing a semiconductor device comprising the steps of:

forming leads at one surface side of a metal laminate plate comprising plural layers containing an etching stopper layer by the surface layer itself or another metal layer further formed on the surface layer, each lead being connected to an electrode of a semiconductor element at one end portion thereof and to an external electrode at the other end portion thereof;

forming an insulating film at said one surface side so as to have said leads embedded therein and have holes for forming the external electrodes;

forming external terminals in said holes so that said external terminals are connected to the other end portions of said leads;

forming reinforcing portions on suspending portions;

selectively etching said laminate plate from the surface side opposite to said one surface to form an outer ring having said suspending portions; and connecting said one end portions of said leads to said electrodes of said semiconductor element.

2. The method as claimed in claim 1, wherein said reinforcing portions on said suspending portions are formed of the same material as said external terminals in the same process as said external terminals.

3. A method for manufacturing a semiconductor device comprising the steps of:

forming leads at one surface side of a metal laminate plate comprising plural layers containing an etching stopper layer by the surface layer itself or another metal layer further formed on the surface layer, each lead being connected to an electrode of a semiconductor element at one end portion thereof and to an external electrode at the other end portion thereof;

forming an insulating film at said one surface side so as to have said leads embedded therein and have holes for forming the external electrodes;

forming external terminals in said holes so that said external terminals are connected to the other end portions of said leads;

forming reinforcing portions on said leads;

selectively etching said laminate plate from the surface side opposite to said one surface to form an outer ring having suspending portions; and connecting said one end portions of said leads to said electrodes of said semiconductor element.

4. The method as claimed in claim 3, wherein said reinforcing portions on said leads are formed by extending said insulating film.

5. The method as claimed in claim 3, wherein said insulating film is extended to the lead extension side with respect to the lead bending position when said leads are connected to said electrodes of said semiconductor element.

* * * * *